US010439039B2

(12) United States Patent
Song et al.

(10) Patent No.: US 10,439,039 B2
(45) Date of Patent: Oct. 8, 2019

(54) INTEGRATED CIRCUITS INCLUDING A FINFET AND A NANOSTRUCTURE FET

(71) Applicant: QUALCOMM Incorporated, San Diego, CA (US)

(72) Inventors: Stanley Seungchul Song, San Diego, CA (US); Jeffrey Junhao Xu, San Diego, CA (US); Kern Rim, San Diego, CA (US); Choh Fei Yeap, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 192 days.

(21) Appl. No.: 15/081,702

(22) Filed: Mar. 25, 2016

(65) Prior Publication Data
US 2017/0278842 A1    Sep. 28, 2017

(51) Int. Cl.
| | |
|---|---|
| *H01L 29/66* | (2006.01) |
| *H01L 29/06* | (2006.01) |
| *H01L 21/8234* | (2006.01) |
| *H01L 27/088* | (2006.01) |
| *H01L 29/10* | (2006.01) |

(Continued)

(52) U.S. Cl.
CPC ........... *H01L 29/66545* (2013.01); *H01L 21/823412* (2013.01); *H01L 21/823431* (2013.01); *H01L 27/0886* (2013.01); *H01L 29/0673* (2013.01); *H01L 29/1054* (2013.01);
(Continued)

(58) Field of Classification Search
CPC ............ H01L 27/0886; H01L 27/0924; H01L 27/1211; H01L 29/41791; H01L 29/66795; H01L 29/785; H01L 29/0673; H01L 29/161; H01L 29/7853–7858; H01L 29/0665; H01L 29/0669; H01L 29/775

See application file for complete search history.

(56) References Cited

U.S. PATENT DOCUMENTS

| | | | |
|---|---|---|---|
| 8,211,772 B2* | 7/2012 | Kavalieros | H01L 29/66795 438/285 |
| 8,536,029 B1* | 9/2013 | Chang | H01L 21/845 257/29 |

(Continued)

OTHER PUBLICATIONS

Buitragoa, E., et al., "The Top-Down Fabrication of a 3D-Integrated, Fully CMOS-Compatible FET Biosensor based on Vertically Stacked SiNWs and FinFETs," Sensors and Actuators B: Chemical, 2014, vol. 193, Elsevier, Amsterdam, Netherlands, pp. 400-412.

(Continued)

*Primary Examiner* — Tuan A Hoang
(74) *Attorney, Agent, or Firm* — Qualcomm Incorporated-Toler

(57) ABSTRACT

An integrated circuit includes a FinFET and a nanostructure FET. The integrated circuit includes a bulk substrate. The integrated circuit also includes a fin field effect transistor (FinFET) coupled to the bulk substrate. The FinFET includes a first source region, a first drain region, and a fin extending between the first source region and the first drain region. The integrated circuit also includes a nanostructure FET coupled to the bulk substrate. The nanostructure FET includes a second source region, a second drain region, and a stack of at least two nanostructures extending between the second source region and the second drain region.

30 Claims, 21 Drawing Sheets

(51) Int. Cl.
    *H01L 29/78*     (2006.01)
    *H01L 29/161*     (2006.01)
    *H01L 29/423*     (2006.01)
    *H01L 29/786*     (2006.01)

(52) U.S. Cl.
    CPC ...... *H01L 29/161* (2013.01); *H01L 29/42392* (2013.01); *H01L 29/785* (2013.01); *H01L 29/78696* (2013.01)

(56) References Cited

U.S. PATENT DOCUMENTS

| | | | |
|---|---|---|---|
| 8,809,957 B2* | 8/2014 | Bangsaruntip | B82Y 10/00 257/351 |
| 9,123,567 B2 | 9/2015 | Radosavljevic et al. | |
| 9,184,269 B2* | 11/2015 | Ching | H01L 21/823821 |
| 2012/0280208 A1* | 11/2012 | Jain | B82Y 10/00 257/20 |
| 2012/0319178 A1* | 12/2012 | Chang | B82Y 10/00 257/287 |
| 2013/0270512 A1* | 10/2013 | Radosavljevic | H01L 21/823821 257/9 |
| 2014/0091360 A1* | 4/2014 | Pillarisetty | H01L 29/7853 257/190 |
| 2014/0175374 A1 | 6/2014 | Chang et al. | |
| 2014/0191323 A1* | 7/2014 | Bergendahl | H01L 21/823431 257/368 |
| 2014/0225065 A1* | 8/2014 | Rachmady | H01L 29/42392 257/24 |
| 2014/0284723 A1* | 9/2014 | Lee | H01L 29/785 257/369 |
| 2015/0041921 A1* | 2/2015 | Choi | H01L 21/823431 257/401 |
| 2015/0372104 A1* | 12/2015 | Liu | H01L 29/42364 257/77 |

OTHER PUBLICATIONS

Dhillon, M.S., "Fabrication of Nanowire MOSFETS," Sep. 25, 2009, Virginia Polytechnic Institute, Blacksburg, Virginia, 14 pages.

* cited by examiner

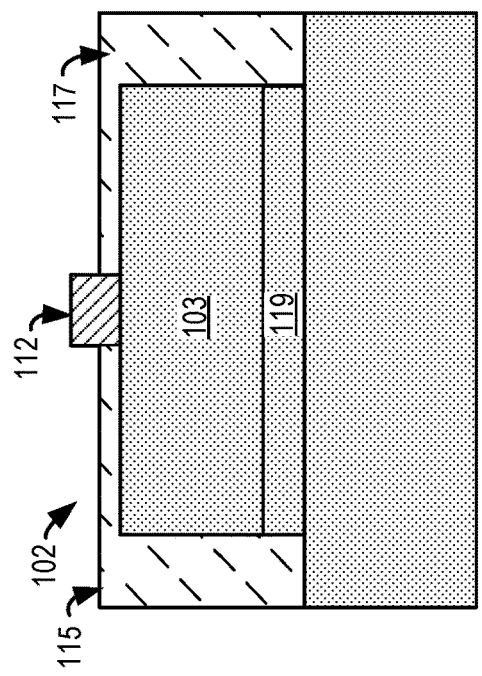
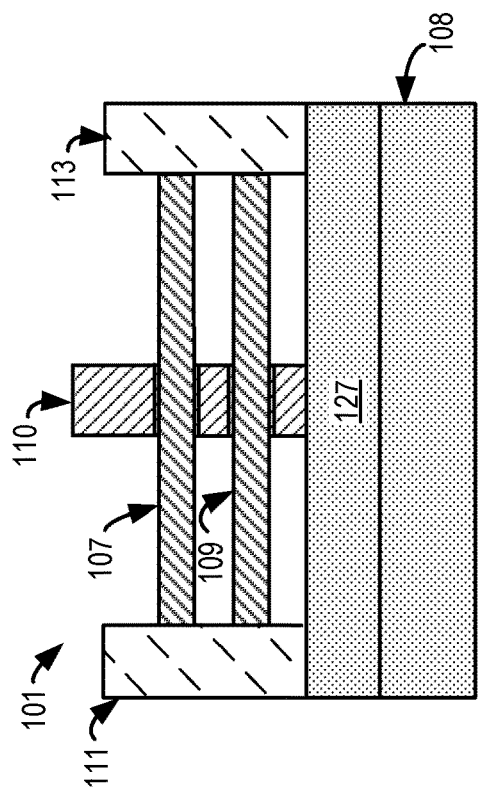

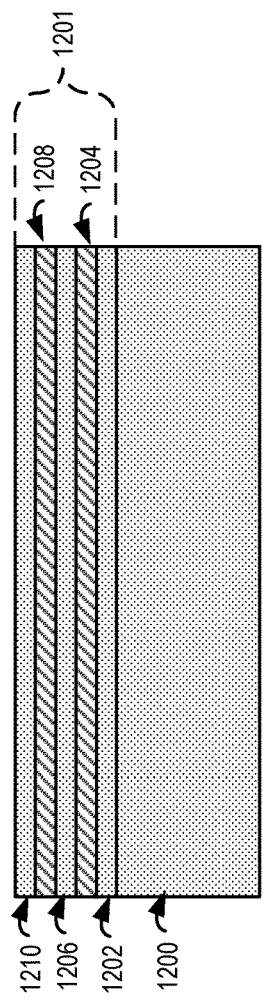
FIG. 12
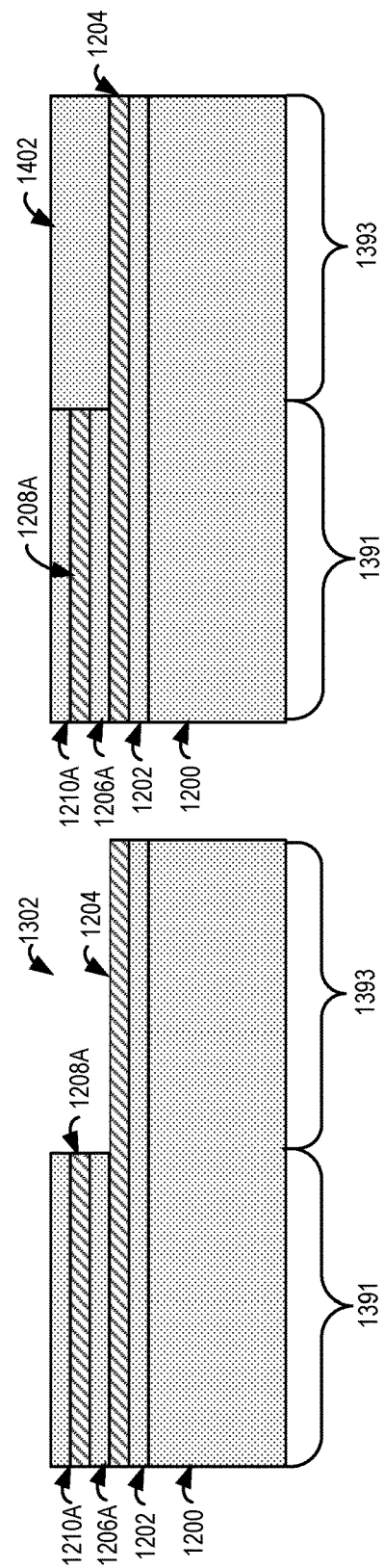
FIG. 14
FIG. 13

INTEGRATED CIRCUITS INCLUDING A FINFET AND A NANOSTRUCTURE FET

I. FIELD

The present disclosure is generally related to fin field effect transistors (FinFETs) and nanowire FETs.

II. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

These devices may include transistors, such as fin field effect transistors (FinFETs) or nanowire FETs. The FinFETs and nanowire FETs are formed on different substrates, thereby increasing space relative to FinFETs and nanowire FETs formed on a single substrate. Additionally, the nanowire FETs may include a single nanowire per nanowire stack, which may limit current capacity.

III. SUMMARY

Integrated circuit devices may include a FinFET and a nanostructure FET on a single substrate. The nanostructure FET may include nanostructure stacks that include multiple nanostructures, thereby increasing current capacity relative to nanostructure FETs that include a single nanostructure per nanostructure stack.

In a particular aspect, an integrated circuit is disclosed. The integrated circuit includes a bulk substrate. The integrated circuit also includes a fin field effect transistor (FinFET) coupled to the bulk substrate. The FinFET includes a first source region, a first drain region, and a fin extending between the first source region and the first drain region. The integrated circuit also includes a nanostructure FET coupled to the bulk substrate. The nanostructure FET includes a second source region, a second drain region, and a stack of at least two nanostructures extending between the second source region and the second drain region.

In another particular aspect, a method of forming an integrated circuit is disclosed. The method includes forming, on a bulk substrate, a fin field effect transistor (FinFET) that includes a first source region, a first drain region, and a fin extending between the first source region and the first drain region. The method also includes forming, on the bulk substrate, a nanostructure FET including a second source region, a second drain region, and a stack of at least two nanostructures extending between the second source region and the second drain region.

In another particular aspect, a non-transitory computer-readable medium is disclosed. The non-transitory computer-readable medium includes processor-executable instructions that, when executed by a processor, cause the processor to initiate fabrication of an integrated circuit device. The integrated circuit device is fabricated by forming, on a bulk substrate, a fin field effect transistor (FinFET) that includes a first source region, a first drain region, and a fin extending between the first source region and the first drain region. The integrated circuit device is further fabricated by forming, on the bulk substrate, a nanostructure FET that includes a second source region, a second drain region, and a stack of at least two nanostructures extending between the second source region and the second drain region.

In another particular aspect, a device is disclosed. The device includes first means for providing charge carriers formed on a bulk substrate. The device also includes first means for collecting charge carriers formed on the bulk substrate. The device also includes first means for forming a conductive channel coupled to the first means for providing and the first means for collecting, the first means for forming the conductive channel formed on the bulk substrate. The device also includes second means for providing charge carriers formed on the bulk substrate. The device also includes second means for collecting charge carriers formed on the bulk substrate. The device also includes second means for forming a conductive channel coupled to the second means for providing and the second means for collecting, the second means for forming the conductive channel having multiple structures, each of the multiple structures having dimensions on the order of a nanometer.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 1B is a cross-sectional view along line A of FIG. 1A;

FIG. 1C is a cross-sectional view along line B of FIG. 1A;

FIG. 12 illustrates a first stage during fabrication of the integrated circuit of FIG. 3A or FIG. 4A;

FIG. 13 illustrates a second stage during fabrication of the integrated circuit of FIG. 3A or FIG. 4A;

FIG. 14 illustrates a third stage during fabrication of the integrated circuit of FIG. 3A or FIG. 4A;

Figure 1A:
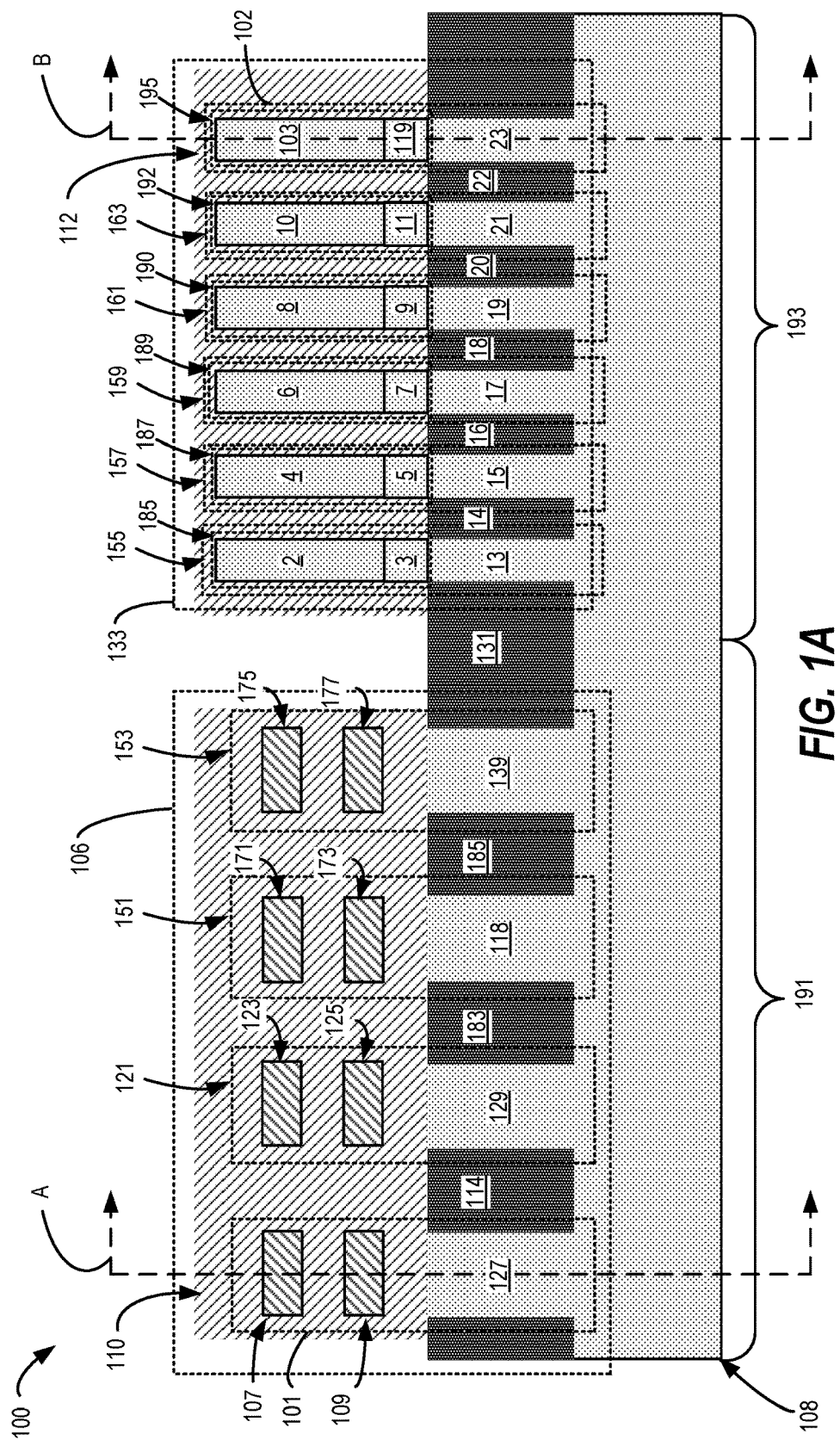
FIG. 1A is a side cross-sectional view of a particular illustrative example of and integrated circuit that includes a FinFET and a nanostructure FET on a bulk substrate.
Figure 2A:
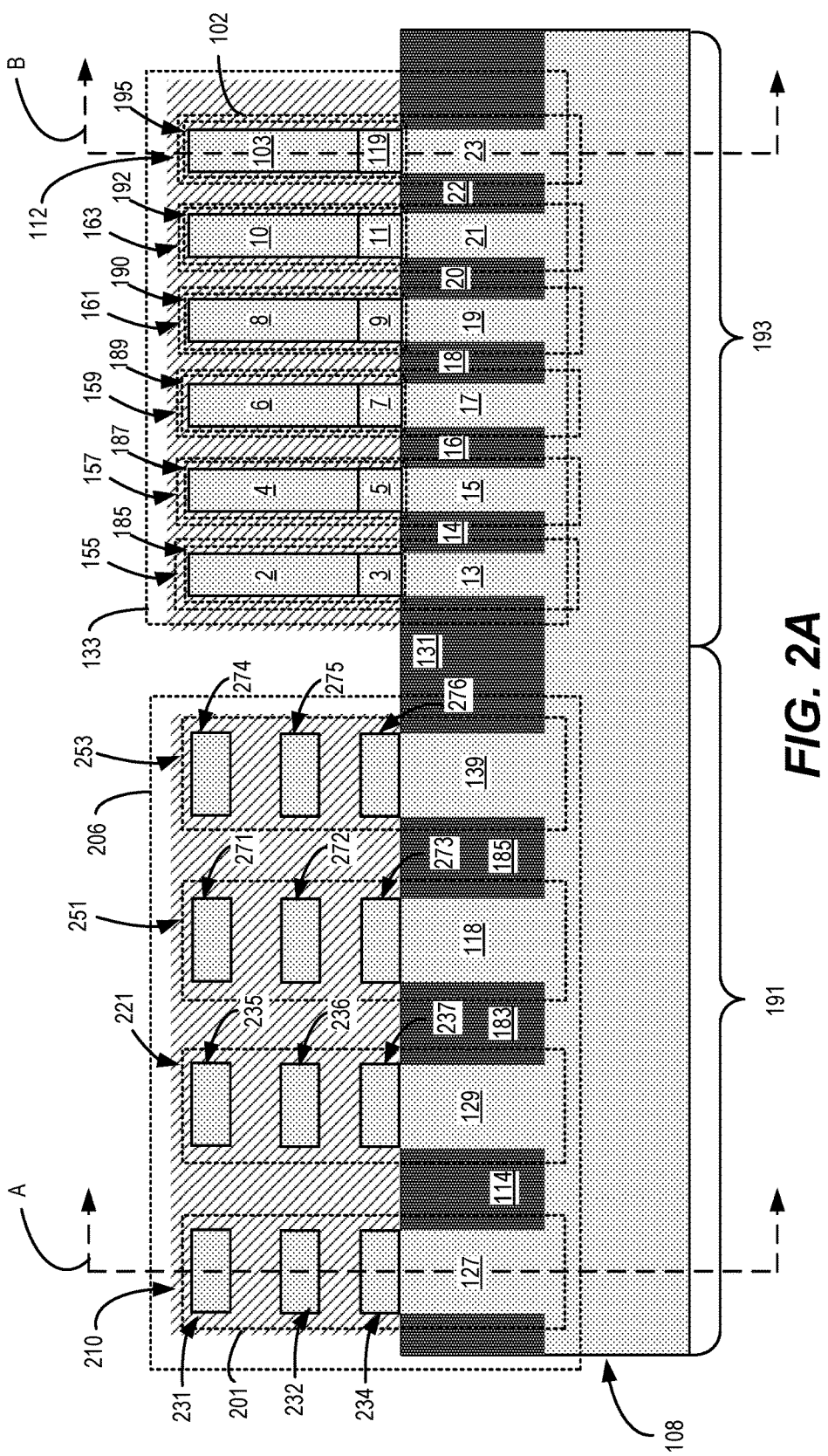
FIG. 2A is a side cross-sectional view of a particular illustrative example of and integrated circuit that includes a FinFET and a nanostructure FET on a bulk substrate.
Figure 3A:
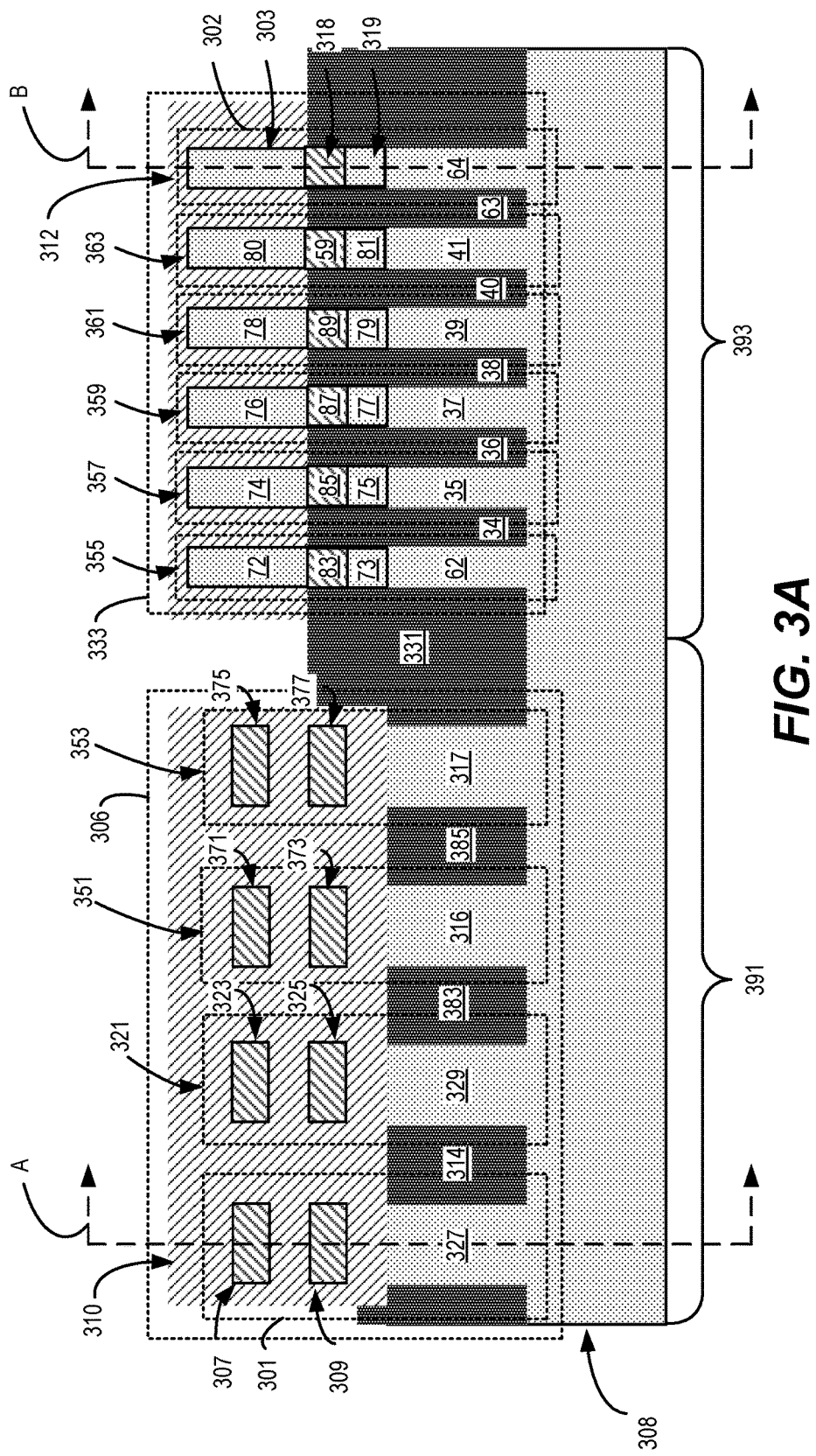
FIG. 3A is a side cross-sectional view of a particular illustrative example of and integrated circuit that includes a FinFET and a nanostructure FET on a bulk substrate.
Figure 4A:
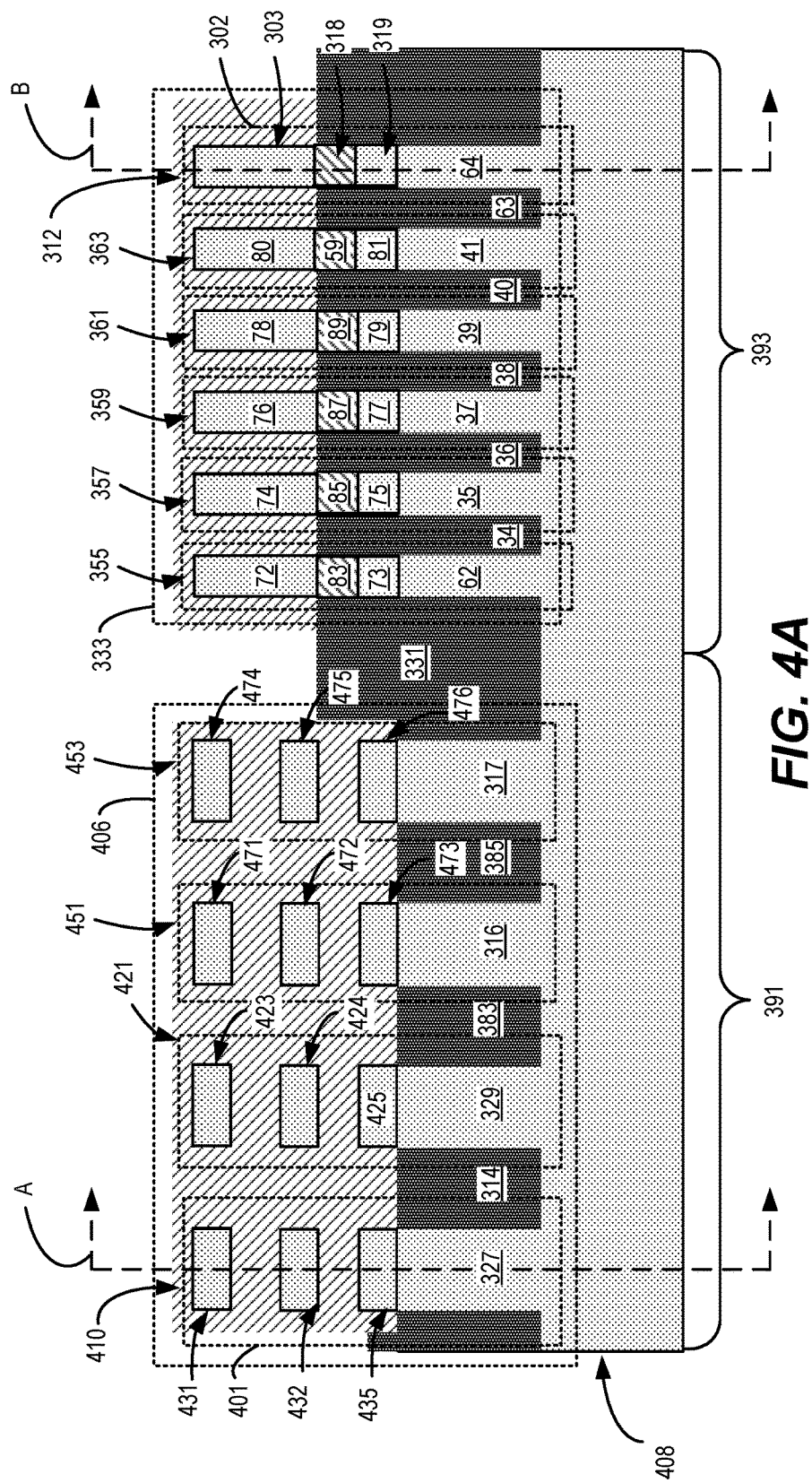
FIG. 4A is a side cross-sectional view of a particular illustrative example of and integrated circuit that includes a FinFET and a nanostructure FET on a bulk substrate.
Figure 20:
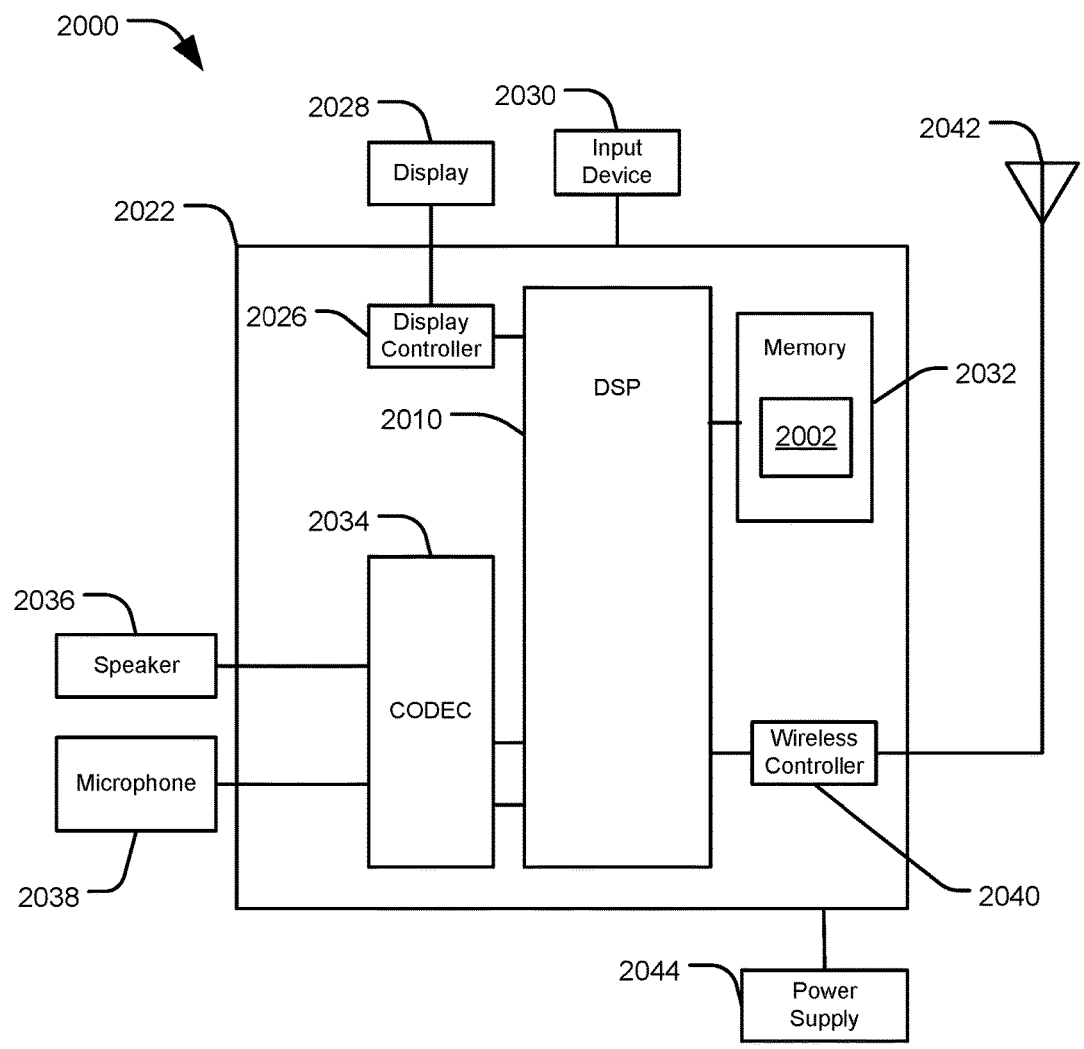
Figure 21:
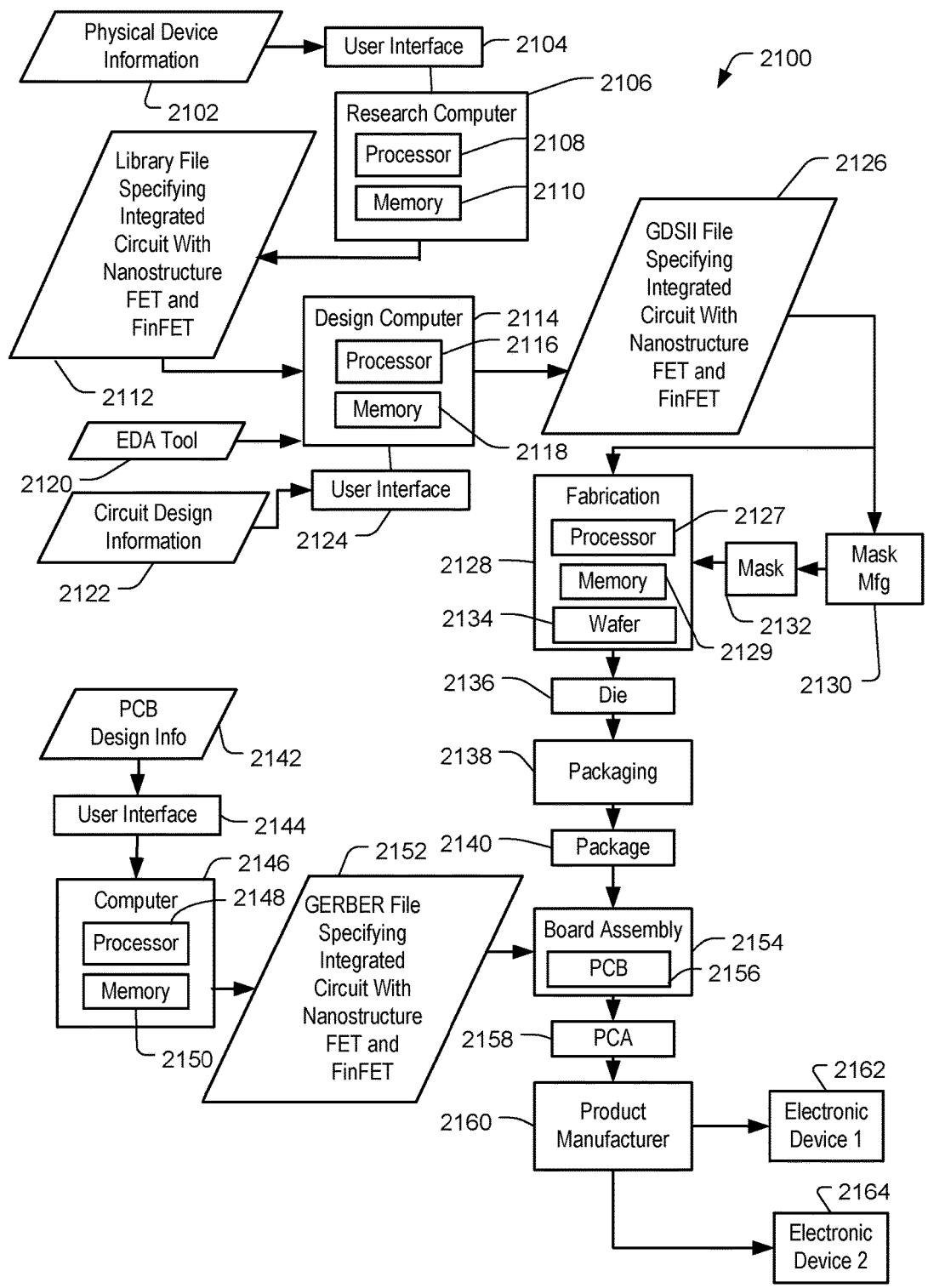

FIG. 20 is a block diagram of portable device including the integrated circuit of FIG. 1A, the integrated circuit of FIG. 2A, the integrated circuit of FIG. 3A, or the integrated circuit of FIG. 4A; and FIG. 21 is a data flow diagram of a particular illustrative example of a manufacturing process to manufacture electronic devices that include the integrated circuit of FIG. 1A, the integrated circuit of FIG. 2A, the integrated circuit of FIG. 3A, or the integrated circuit of FIG. 4A.

V. DETAILED DESCRIPTION

Referring to FIGS. 1A, 1B, and 1C, an example of an integrated circuit including a nanostructure field effect transistor (FET) and a FinFET is illustrated and generally designated 100. The integrated circuit 100 includes a bulk substrate 108. The bulk substrate 108 may be formed of a semiconductor material, such as silicon. The bulk substrate 108 may differ from a silicon on insulator (SOI) substrate in that the bulk substrate 108 does not include an insulator layer (e.g., a buried oxide layer). The bulk substrate 108 may be patterned. For example, the bulk substrate 108 may be patterned to form trenches in which isolation material is deposited to form shallow trench isolation (STI) regions and bases (e.g., stack bases) as described in more detail below.

The integrated circuit 100 includes a fin field effect transistor (FinFET) 133 coupled to the bulk substrate 108. The FinFET 133 includes a first source region 115, a first drain region 117, and a fin extending between the first source region 115 and the first drain region 117. The FinFET 133 may be formed proximate to a first region 193 of the bulk substrate 108.

In some examples, the FinFET 133 includes multiple FinFET stacks. For example, the FinFET 133 may include FinFET stacks 155, 157, 159, 161, 163, and 102. Although FIG. 1A illustrates the FinFET 133 as including six FinFET stacks, the FinFET 133 may include more than or less than six FinFET stacks. Each of the FinFET stacks 155, 157, 159, 161, 163, and 102 may include a fin formed on a portion of the bulk substrate 108 (e.g., formed on a FinFET stack base). Each of the fins may be formed of or may include a portion of an epitaxial layer (that is formed on the FinFET stack base) and a portion of a fill layer formed on the epitaxial layer as described in more detail with reference to FIGS. 5-8.

Figure 7:
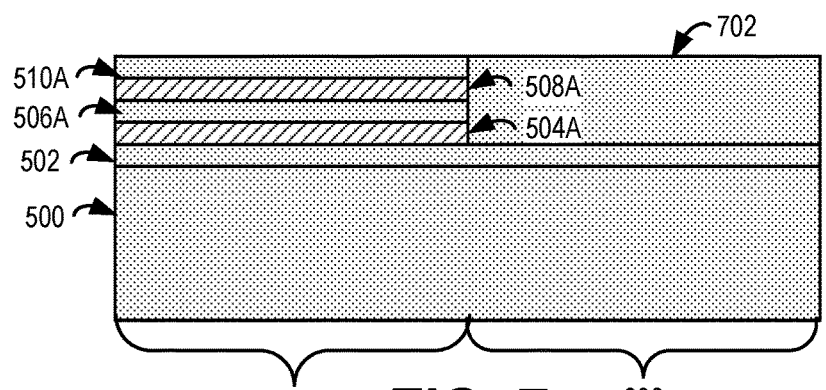
FIG. 7 illustrates a third stage during fabrication of the integrated circuit of FIG. 1A or FIG. 2A.

For example, the FinFET stack 155 may include a first fin 185 formed of a portion 3 of an epitaxial layer and a portion 2 of a fill layer (e.g., the fill layer 702 of FIG. 7). The portion 3 of the epitaxial layer may be formed or located on a portion of the bulk substrate 108 (e.g., formed or located on a FinFET stack base 13 of the FinFET stack 155). The FinFET stack 157 of FIG. 1A may include a second fin 187 formed of a portion 5 of the epitaxial layer and a portion 4 of the fill layer. The portion 5 of the epitaxial layer may be formed or located on a portion of the bulk substrate 108 (e.g., formed or located on a FinFET stack base 15 of the FinFET stack 157). The FinFET stack 159 may include a third fin 189 formed of a portion 7 of the epitaxial layer and a portion 6 of the fill layer. The portion 7 of the epitaxial layer may be formed or located on a portion of the bulk substrate 108 (e.g., formed or located on a FinFET stack base 17 of the FinFET stack 159). The FinFET stack 161 may include a fourth fin 191 formed of a portion 9 of the epitaxial layer and a portion 8 of the fill layer. The portion 9 of the epitaxial layer may be formed or located on a portion bulk substrate 108 (e.g., formed or located on a FinFET stack base 19 of the FinFET stack 161). The FinFET stack 163 may include a fifth fin 192 formed of a portion 11 of the epitaxial layer and a portion 10 of the fill layer. The portion 11 of the epitaxial layer may be formed or located on a portion of the bulk substrate 108 (e.g., formed or located on a FinFET stack base 21 of the FinFET stack 163). The FinFET stack 102 may include a sixth fin 195 formed of a portion 119 of the epitaxial layer and a portion 103 of the fill layer. The portion 119 of the epitaxial layer may be formed or located on a portion of the bulk substrate 108 (e.g., formed or located on a FinFET stack base 23 of the FinFET stack 102).

One or more of the first fin 185, the second fin 187, the third fin 189, the fourth fin 191, the fifth fin 192, or the sixth fin 195 of the FinFET 133 may extend between the first source region 115 and the first drain region 117. For example, the sixth fin 195 may extend between the first source region 115 and the first drain region 117.

The integrated circuit 100 may include STI regions between one or more of the FinFET stacks 155, 157, 159, 161, 163, and 102. For example, the integrated circuit 100 may include an STI region 14 between the FinFET stack 155 and the FinFET stack 157 (e.g., between the FinFET stack base 13 and the FinFET stack base 15). Additionally or alternatively, the integrated circuit 100 may include an STI region 16 between the FinFET stack 157 and the FinFET stack 159 (e.g., between the FinFET stack base 15 and the FinFET stack base 17). Additionally or alternatively, the integrated circuit 100 may include an STI region 18 between the FinFET stack 159 and the FinFET stack 161 (e.g., between the FinFET stack base 17 and the FinFET stack base 19). Additionally or alternatively, the integrated circuit 100 may include an STI region 20 between the FinFET stack 161 and the FinFET stack 163 (e.g., between the FinFET stack base 19 and the FinFET stack base 21). Additionally or alternatively, the integrated circuit 100 may include an STI region 22 between the FinFET stack 163 and the FinFET stack 102 (e.g., between the FinFET stack base 21 and the FinFET stack base 23). The STI regions 14, 16, 18, 20, and 22 may be formed in trenches of the bulk substrate 108 as described in more detail below.

The FinFET 133 may also include a gate region, such as the gate region 112. The gate region 112 may cover one or more portions of one or more of the fins of the FinFET stacks 155, 157, 159, 161, 163, and 102. A portion(s) of the fins of the FinFET stacks 155, 157, 159, 161, 163, and 102 proximate to (e.g., covered by) the gate region 112 may serve as a channel region.

The integrated circuit 100 further includes a nanostructure FET 106 that is coupled to the bulk substrate 108 and that includes a second source region 111, a second drain region 113, and a stack of at least two nanostructures extending between the second source region 111 and the second drain region 113. The nanostructure FET 106 may be formed proximate to a second region 191 of the bulk substrate 108. The nanostructure FET 106 may be an n-type FET.

The nanostructure FET 106 may include multiple stacks of nanostructure FETs. To illustrate, the nanostructure FET 106 may include a first nanostructure FET stack 101, a second nanostructure FET stack 121, a third nanostructure FET stack 151, and a fourth nanostructure FET stack 153. Although the nanostructure FET 106 is illustrated as including four nanostructure FET stacks, the nanostructure FET 106 may include more than or less than four nanostructure FET stacks.

The first nanostructure FET stack 101 may include a stack of at least two nanostructures 107 and 109 located above a portion (e.g., a nanostructure FET stack base) 127 of the bulk substrate 108 and extending between the second source region 111 and the second drain region 113. As another example, the second nanostructure FET stack 121 may include a stack of at least two nanostructures 123 and 125 located above a portion (e.g., a nanostructure FET stack base) 129 of the bulk substrate 108 and extending between the second source region 111 and the second drain region 113. Additionally or alternatively, the third nanostructure FET stack 151 may include a stack of at least two nanostructures 171 and 173 located above a portion (e.g., a nanostructure FET stack base) 118 of the bulk substrate 108 and extending between the second source region 111 and the second drain region 113. Additionally or alternatively, the fourth nanostructure FET stack 153 may include a stack of at least two nanostructures 175 and 177 located above a portion (e.g., a nanostructure FET stack base) 119 of the bulk substrate 108 and extending between the second source region 111 and the second drain region 113.

One or more of the nanostructures 107, 109, 123, 125, 171, 173, 175, or 177 may be a nanowire (e.g., a nanostructure having a circular cross-section) or a nanoslab (e.g., a nanostructure having a non-circular cross-section). A nanostructure may have one or more dimensions on the order of a nanometer. The nanostructures 107, 109, 123, 125, 171, 173, 175, or 177 may be formed of portions of an alternating bilayer (e.g., the alternating bilayer 501 of FIG. 5) that is formed of multiple epitaxial layers (e.g., 502, 504, 506, 508, and 510). For example, the nanostructures 107, 109, 123, 125, 171, 173, 175, or 177 may be formed of portions of a second epitaxial layer 504 and a fourth epitaxial layer 508 as described in more detail below with reference to FIGS. 5-10. In some examples, the nanostructures 107, 109, 123, 125, 171, 173, 175, or 177 may be formed of the same material. Alternatively or additionally, the nanostructures 107, 109, 123, 125, 171, 173, 175, or 177 may be formed of a different material than the bulk substrate 108. In some examples, the nanostructures 107, 109, 123, 125, 171, 173, 175, or 177 are formed of silicon germanium.

The integrated circuit 100 may include STI regions between one or more of the nanostructure FET stacks 101, 121, 151, and 153. For example, the integrated circuit 100 may include an STI region 114 between the first nanostructure FET stack 101 and the second nanostructure FET stack 121 (e.g., between the nanostructure FET stack base 127 and the nanostructure FET stack base 129). Additionally or alternatively, the integrated circuit 100 may include an STI region 183 between the second nanostructure FET stack 121 and the third nanostructure FET stack 151 (e.g., between the nanostructure FET stack base 129 and the nanostructure FET stack base 118). Additionally or alternatively, the integrated circuit 100 may include an STI region 185 between the third nanostructure FET stack 151 and the fourth nanostructure FET stack 153 (e.g., between the nanostructure FET stack base 118 and the nanostructure FET stack base 119). The STI regions 114, 183, and 185 may be formed in trenches of the bulk substrate 108 as described in more detail below. Although FIG. 1A illustrates three STI regions between the nanostructure FET stacks, the nanostructure FET 106 may include more than or less than three STI regions. For example, the nanostructure FET 106 may include two nanostructure FET stacks (as opposed to four nanostructure FET stacks), and may include a single STI region between the two nanostructure FET stacks.

The nanostructure FET 106 may include a gate region 110. At least a portion of the gate region 110 may be coupled to one or more of the STI regions 114, 183, and 185 and may cover or surround one or more portions of one or more of the nanostructures 107, 109, 123, 125, 171, 173, 175, or 177. A portion(s) of one or more of the nanostructures 107, 109, 123, 125, 171, 173, 175, or 177 proximate to (e.g., surrounded by) the gate region 110 may serve as a channel region.

A top of one or more of the fins 185, 187, 189, 191, 192, or 195 of the FinFET 133 may be a first distance from the bulk substrate 108 (e.g., from a top of respective FinFET stack bases 13, 15, 17, 19, 21, and 23) and a top of a top nanostructure of one or more of the nanostructure FET stacks 101, 121, 151, and 153 may be a second distance from the bulk substrate 108 (e.g., from a top of respective nanostructure FET stack bases 127, 129, 118, and 119). The first distance may be greater than the second distance. For example, a first distance from a top of the fin 185 to a top of the FinFET stack base 13 may be greater than a second distance from a top of the nanostructure 175 to a top of the base 119.

Thus, the integrated circuit 100 of FIG. 1A may include a FinFET and a nanostructure FET on a single substrate, thereby decreasing space relative to FinFETs and nanowire FETs formed on different substrates. Additionally, the nanostructure FET may include multiple nanostructures per nanostructure stacks, which may increase current capacity compared to nanostructure FETs that include a single nanostructure per nanostructure stack.

Figure 2C:
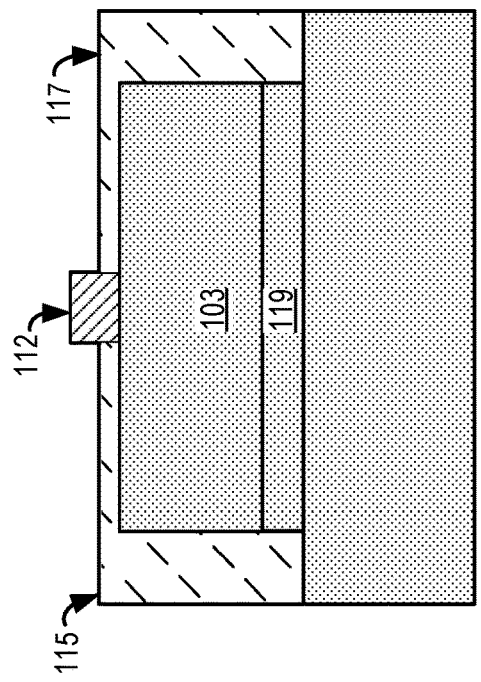
FIG. 2C is a cross-sectional view along line B of FIG. 2A.
Figure 2B:
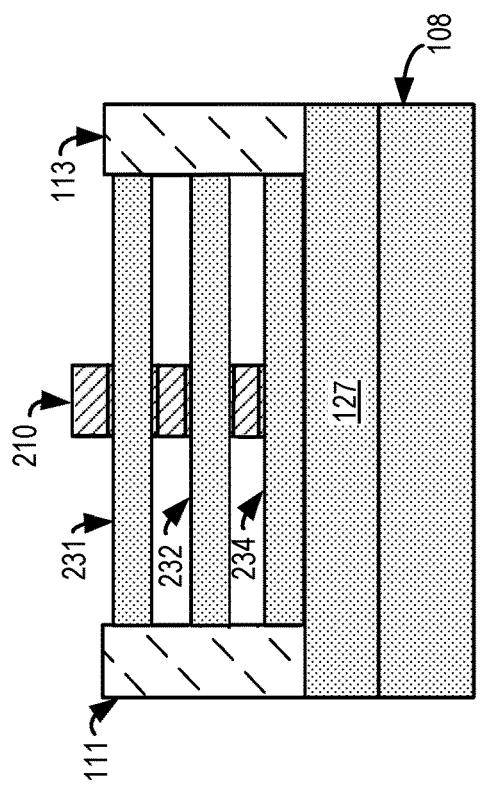
FIG. 2B is a cross-sectional view along line A of FIG. 2A.

Referring to FIGS. 2A, 2B, and 2C, an example of an integrated circuit including a nanostructure field effect transistor (FET) and a FinFET (e.g., the FinFET as described above with reference to FIG. 1A) is illustrated and generally designated 200. The integrated circuit 200 includes a bulk substrate 108. The bulk substrate 108 may be formed and structured as described above with reference to the bulk substrate 108 of FIG. 1A.

The integrated circuit 200 of FIG. 2A includes a fin field effect transistor (FinFET) 133 coupled to the bulk substrate 108. The FinFET 133 of FIG. 2A may include a fin 195 extending between a first source region 115 and a first drain region 117 of FIG. 2C. The FinFET 133 of FIG. 2A may be structured as described above with reference to the FinFET 133 of FIG. 2A and may be formed as described below with reference to FIGS. 5-9 and 11.

The integrated circuit 200 of FIG. 2A further includes a nanostructure FET 206 that is coupled to the bulk substrate 208 and that includes a second source region 111 of FIG. 2B, a second drain region 113 of FIG. 2B, and a stack of at least two nanostructures extending between the second source region 111 and the second drain region 113. The nanostructure FET 206 may be formed proximate to a second region 191 of the bulk substrate 108 of FIG. 2A. The nanostructure FET 206 may be a p-type FET.

The nanostructure FET 206 may include multiple stacks of nanostructure FETs. To illustrate, the nanostructure FET 206 may include a first nanostructure FET stack 201, a second nanostructure FET stack 221, a third nanostructure FET stack 251, and a fourth nanostructure FET stack 253. The first nanostructure FET stack 201 may include a stack of at least two nanostructures (e.g., at least three nanostructures) 231, 232, and 234 located above a portion (e.g., a nanostructure FET stack base) 127 of the bulk substrate 108 and extending between the second source region 111 and the second drain region 113 of FIG. 2B. As another example, the second nanostructure FET stack 221 may include a stack of at least two nanostructures (e.g., at least three nanostructures) 235, 236, and 237 located above a portion (e.g., a nanostructure FET stack base) 129 of the bulk substrate 108 and extending between the second source region 111 and the second drain region 113. Additionally or alternatively, the third nanostructure FET stack 251 may include a stack of at least two nanostructures (e.g., at least three nanostructures) 271, 272, and 273 located above a portion (e.g., a nanostructure FET stack base) 118 and extending between the second source region 111 and the second drain region 113. Additionally or alternatively, the fourth nanostructure FET stack 253 may include a stack of at least two nanostructures (e.g., at least three nanostructures) 274, 275, and 276 located above a portion (e.g., a nanostructure FET stack base) 139 and extending between the second source region 111 and the second drain region 113. Although the nanostructure FET 206 is illustrated as including four nanostructure FET stacks, the nanostructure FET 206 may include more than or less than four nanostructure FET stacks.

One or more of the nanostructures 231, 232, 234, 235, 236, 237, 271, 272, 273, 274, 275, or 276 may be a nanowire or a nanoslab. The nanostructures 231, 232, 234, 235, 236, 237, 271, 272, 273, 274, 275, or 276 may be formed of portions of an alternating bilayer (e.g., the alternating bilayer 501 of FIG. 5) that is formed of multiple epitaxial layers (e.g., 502, 504, 506, 508, and 510). For example, the nanostructures 231, 232, 234, 235, 236, 237, 271, 272, 273, 274, 275, or 276 may be formed of portions of a first epitaxial layer 502, a third epitaxial layer 506, and a fifth epitaxial layer 510 as described in more detail below with reference to FIGS. 5-9 and 11. In some examples, the nanostructures 231, 232, 234, 235, 236, 237, 271, 272, 273, 274, 275, or 276 may be formed of the same material. Alternatively or additionally, the nanostructures 231, 232, 234, 235, 236, 237, 271, 272, 273, 274, 275, or 276 may be formed of the same material as the bulk substrate 208. In some examples, the nanostructures 231, 232, 234, 235, 236, 237, 271, 272, 273, 274, 275, or 276 are formed of silicon.

The integrated circuit 200 may include STI regions between one or more of the nanostructure FET stacks 201, 221, 251, and 253. For example, the integrated circuit may include an STI region 114 between the first nanostructure FET stack 201 and the second nanostructure FET stack 221 (e.g., between the nanostructure FET stack base 127 and the nanostructure FET stack base 129). Additionally or alternatively, the integrated circuit 200 may include an STI region 183 between the second nanostructure FET stack 221 and the third nanostructure FET stack 251 (e.g., between the nanostructure FET stack base 129 and the nanostructure FET stack base 118). Additionally or alternatively, the integrated circuit 200 may include an STI region 185 between the third nanostructure FET stack 251 and the fourth nanostructure FET stack 253 (e.g., between the nanostructure FET stack base 118 and the nanostructure FET stack base 139). The STI regions 114, 183, and 185 may be formed in trenches of the bulk substrate 108 of FIG. 2A as described in more detail below with reference to FIGS. 8 and 9.

The nanostructure FET 206 may include a gate region 210. The gate region 210 may be coupled to one or more of the STI regions 214, 283, and 285 and may surround or cover one or more portions of one or more of the nanostructures 231, 232, 234, 235, 236, 237, 271, 272, 273, 274, 275, or 276. A portion(s) of one or more of the nanostructures 231, 232, 234, 235, 236, 237, 271, 272, 273, 274, 275, or 276 proximate to (e.g., surrounded or covered by) the gate region 210 may serve as a channel region.

A top of one or more of the fins 185, 187, 189, 190, 192, or 195 of the FinFET 133 of FIG. 2A may be a first distance from the bulk substrate 108 of FIG. 2A (e.g., a first distance from a top of respective FinFET stack bases 13, 15, 17, 19, 21, or 23), and a top of a top nanostructure of one or more of the nanostructure FET stacks 201, 221, 251, and 253 may be a second distance from the bulk substrate 108 of FIG. 2A (e.g., from a top of respective nanostructure FET stack bases 127, 129, 118, and 139). The first distance may be substantially equal to the second distance. For example, a first distance from a top of the fin 185 to a top of the base 13 of FIG. 2A may be substantially equal to a second distance from a top of the nanostructure 274 to a top of the base 139 of FIG. 2A.

Thus, the integrated circuit 200 of FIG. 2A may include a FinFET and a nanostructure FET on a single substrate, thereby decreasing space relative to FinFETs and nanowire FETs formed on different substrates. Additionally, the nanostructure FET may include multiple nanostructures per nanostructure stacks, which may increase current capacity compared to nanostructure FETs that include a single nanostructure per nanostructure stack.

Figure 3C:
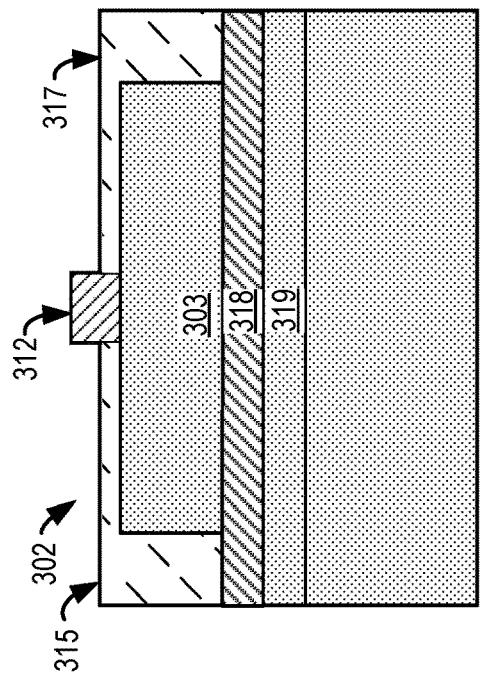
FIG. 3C is a cross-sectional view along line B of FIG. 3A.
Figure 3B:
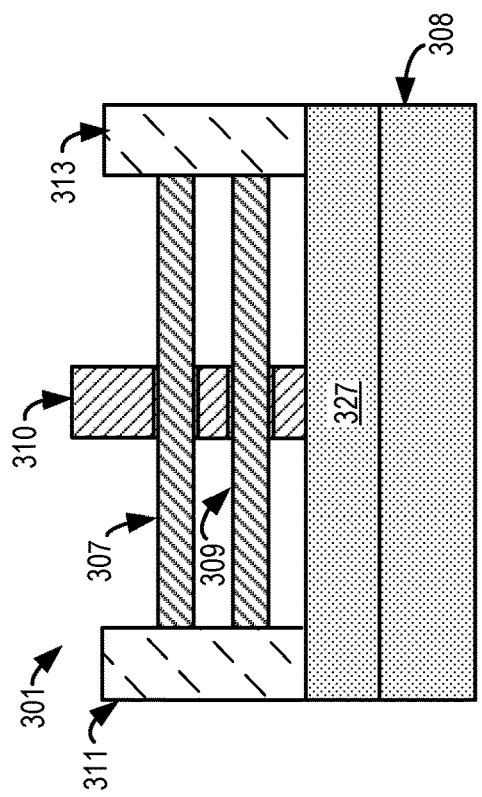
FIG. 3B is a cross-sectional view along line A of FIG. 3A.

Referring to FIGS. 3A, 3B, and 3C, an example of an integrated circuit including a nanostructure field effect transistor (FET) and a FinFET is illustrated and generally designated 300. The integrated circuit 300 includes a bulk substrate 308. The bulk substrate 308 may be formed of a semiconductor material, such as silicon. The bulk substrate 308 may differ from a silicon on insulator (SOI) substrate in that the bulk substrate 308 does not include an insulator layer (e.g., a buried oxide layer). The bulk substrate 308 may be patterned. For example, the bulk substrate 308 may be patterned to form trenches in which isolation material is deposited to form shallow trench isolation (STI) regions and bases (e.g., stack bases) as described in more detail below.

The integrated circuit 300 includes a fin field effect transistor (FinFET) 333 coupled to the bulk substrate 308. The FinFET 333 includes a first source region 315, a first drain region 317, and a fin extending between the first source region 315 and the first drain region 317. The FinFET 333 may be formed proximate to a first region 393 of the bulk substrate 308.

In some examples, the FinFET 333 includes multiple FinFET stacks. For example, the FinFET 333 may include FinFET stacks 355, 357, 359, 361, 363, and 302. Although FIG. 3A illustrates the FinFET 333 as including six FinFET stacks, the FinFET 333 may include more than or less than six FinFET stacks. Each of the FinFET stacks 355, 357, 359, 361, 363, and 302 may include a fin formed of a portion of a fill layer formed on a FinFET stack base as described in more detail with reference to FIGS. 12-15.

For example, the FinFET stack 355 may include a first fin 72 formed of a first portion of a fill layer (e.g., the fill layer 702 of FIG. 7). The FinFET stack 357 of FIG. 3A may include a second fin 74 formed of a second portion of the fill layer. The FinFET stack 359 may include a third fin 76 formed of a third portion of the fill layer. The FinFET stack 361 may include a fourth fin 78 formed of a fourth portion of the fill layer. The FinFET stack 363 may include a fifth fin 80 formed of a fifth portion of the fill layer. The FinFET stack 302 may include a sixth fin 303 formed of a sixth portion of the fill layer.

Each of the fins 72, 74, 76, 78, 80, and 303 may be formed on respective FinFET stack bases formed of a portion of the bulk substrate 308, a portion of a first epitaxial layer (e.g., a first epitaxial layer 1202 of FIG. 12), and a portion of a second epitaxial layer (e.g., a second epitaxial layer 1204 of FIG. 12). For example, the fin 72 may be formed on a FinFET stack base formed of a portion 62 of the bulk substrate 308, a portion 73 of the first epitaxial layer, and a portion 83 of the second epitaxial layer. As another example, the fin 74 may be formed on a FinFET stack base formed of a portion 35 of the bulk substrate 308, a portion 75 of the first epitaxial layer, and a portion 85 of the second epitaxial layer. As another example, the fin 76 may be formed on a FinFET stack base formed of a portion 37 of the bulk substrate 308, a portion 77 of the first epitaxial layer, and a portion 87 of the second epitaxial layer. As another example, the fin 78 may be formed on a FinFET stack base formed of a portion 39 of the bulk substrate 308, a portion 79 of the first epitaxial layer, and a portion 89 of the second epitaxial layer. As another example, the fin 80 may be formed on a FinFET stack base formed of a portion 41 of the bulk substrate 308, a portion 81 of the first epitaxial layer, and a portion 91 of the second epitaxial layer. As another example, the fin 303 may be formed on a FinFET stack base formed of a portion 64 of the bulk substrate 308, a portion 319 of the first epitaxial layer, and a portion 318 of the second epitaxial layer.

One or more of the fins 72, 74, 76, 78, 80, or 303 may be formed of a first material and one or more of the portions 83, 85, 87, 89, 59, and 318 may be formed of a second material that is different than the first material. For example, the first material may correspond to silicon and the second material may correspond to silicon germanium. In some examples, one or more of the portions 73, 75, 77, 79, 81, and 319 may be formed of a third material. In some examples, the third material may be the same as the first material.

One or more of the first fin 72, the second fin 74, the third fin 76, the fourth fin 78, the fifth fin 80, or the sixth fin 303 of the FinFET 333 may extend between the first source region 315 and the first drain region 317 of FIG. 3C. For example, the sixth fin 303 may extend between the first source region 315 and the first drain region 317.

The integrated circuit 300 may include STI regions between one or more of the FinFET stacks 355, 357, 359, 361, 363, and 302. For example, the integrated circuit 300 may include an STI region 34 between the FinFET stack 355 and the FinFET stack 357 (e.g., between the FinFET stack base formed of the portions 62, 73, and 83 and the FinFET stack base formed of the portions 35, 75, and 85). Additionally or alternatively, the integrated circuit 300 may include an STI region 36 between the FinFET stack 357 and the FinFET stack 359 (e.g., between the FinFET stack base formed of the portions 35, 75, and 85 and the FinFET stack base formed of the portions 37, 77, and 87). Additionally or alternatively, the integrated circuit 300 may include an STI region 38 between the FinFET stack 359 and the FinFET stack 361 (e.g., between the FinFET stack base formed of the portions 37, 77, and 87 and the FinFET stack base formed of the portions 39, 79, and 89). Additionally or alternatively, the integrated circuit 300 may include an STI region 40 between the FinFET stack 361 and the FinFET stack 363 (e.g., between the FinFET stack base formed of the portions 39, 79, and 89 and the FinFET stack base formed of the portions 41, 81, and 91). Additionally or alternatively, the integrated circuit 300 may include an STI region 42 between the FinFET stack 363 and the FinFET stack 302 (e.g., between the FinFET stack base formed of the portions 41, 81, and 91 and the FinFET stack base formed of the portions 64, 319, and 318). The STI regions 34, 36, 38, 40, and 42 may be formed in trenches of the bulk substrate 308 as described in more detail below.

The FinFET 333 may also include a gate region, such as the gate region 312. The gate region 312 may cover one or more portions of the fins of the FinFET stacks 355, 357, 359, 361, 363, and 302. A portion(s) of one or more of the fins (of the FinFET stacks 355, 357, 359, 361, 363, and 302) that are proximate to (e.g., covered by) the gate region 312 may serve as a channel region.

The integrated circuit 300 further includes a nanostructure FET 306 that is coupled to the bulk substrate 308 and that includes a second source region 311, a second drain region 313, and a stack of at least two nanostructures extending between the second source region 311 and the second drain region 313. The nanostructure FET 306 may be formed proximate to a second region 391 of the bulk substrate 308. The nanostructure FET 306 may be an n-type FET.

The nanostructure FET 306 may include multiple stacks of nanowire FETs. To illustrate, the nanostructure FET 306 may include a first nanostructure FET stack 301, a second nanostructure FET stack 321, a third nanostructure FET stack 351, and a fourth nanostructure FET stack 353. Although the nanostructure FET 306 is illustrated as including four nanostructure FET stacks, the nanostructure FET 306 may include more than or less than four nanostructure FET stacks.

The first nanostructure FET stack 301 may include a stack of at least two nanostructures 307 and 309 located above a portion (e.g., a nanostructure FET stack base) 327 of the bulk substrate 308 and extending between the second source region 311 and the second drain region 313. As another example, the second nanostructure FET stack 321 may include a stack of at least two nanostructures 323 and 325 located above a portion (e.g., a nanostructure FET stack base) 329 of the bulk substrate 308 and extending between the second source region 311 and the second drain region 313. Additionally or alternatively, the third nanostructure FET stack 351 may include a stack of at least two nanostructures 371 and 373 located above a portion (e.g., a nanostructure FET stack base) 316 of the bulk substrate 308 and extending between the second source region 311 and the second drain region 313. Additionally or alternatively, the fourth nanostructure FET stack 353 may include a stack of at least two nanostructures 375 and 377 located above a portion (e.g., a nanostructure FET stack base) 317 of the bulk substrate 308 and extending between the second source region 311 and the second drain region 313.

One or more of the nanostructures 307, 309, 323, 325, 371, 373, 375, and 377 may be a nanowire or a nanoslab. The nanostructures 307, 309, 323, 325, 371, 373, 375, and 377 may be formed of portions of an alternating bilayer (e.g., the alternating bilayer 1201 of FIG. 12) that is formed of multiple epitaxial layers (e.g., epitaxial layers 1202, 1204, 1206, 1208, and 1210). For example, the nanostructures 307, 309, 323, 325, 371, 373, 375, and 377 may be formed of portions of the second epitaxial layer 1204 and a fourth epitaxial layer 1208 as described in more detail below with reference to FIGS. 12-17. In some examples, the nanostructures 307, 309, 323, 325, 371, 373, 375, and 377 may be formed of the same material. Alternatively or additionally, the nanostructures 307, 309, 323, 325, 371, 373, 375, and 377 may be formed different material than the bulk substrate 308. In some examples, the nanostructures 307, 309, 323, 325, 371, 373, 375, and 377 are formed of silicon germanium.

The integrated circuit 300 may include STI regions between one or more of the nanostructure FET stacks 301, 321, 351, and 353. For example, the integrated circuit may include an STI region 314 between the first nanostructure FET stack 301 and the second nanostructure FET stack 321 (e.g., between the nanostructure FET stack base 327 and the nanostructure FET stack base 329). Additionally or alternatively, the integrated circuit 300 may include an STI region 383 between the second nanostructure FET stack 321 and the third nanostructure FET stack 351 (e.g., between the nanostructure FET stack base 329 and the nanostructure FET stack base 316). Additionally or alternatively, the integrated circuit 300 may include an STI region 385 between the third nanostructure FET stack 351 and the fourth nanostructure FET stack 353 (e.g., between the nanostructure FET stack base 316 and the nanostructure FET stack base 317). The STI regions 314, 383, and 385 may be formed in trenches of the bulk substrate 308 as described in more detail below.

The nanostructure FET 306 may include a gate region 310. The gate region 310 may be coupled to one or more of the STI regions 314, 383, and 385 and may surround or cover one or more portions of one or more of the nanostructures 307, 309, 323, 325, 371, 373, 375, and 377. A portion(s) of one or more of the nanostructures 307, 309, 323, 325, 371, 373, 375, and 377 proximate to (e.g., surrounded or covered by) the gate region 310 may serve as a channel region.

A top of one or more of the fins 72 may be a first distance from the bulk substrate 308 (e.g., from a top of respective portions 62, 35, 37, 39, 41, and 64), and a top of a top nanostructure of one or more of the nanostructure FET stacks 301, 321, 351, and 353 may be a second distance from the bulk substrate 308 (e.g., from a top of respective nanostructure FET stack bases 327, 329, 316, and 317). The first distance may be greater than the second distance. For example, a first distance from a top of the fin 72 to a top of the portion 62 may be greater than a second distance from a top of the nanostructure 375 to a top of the nanostructure FET stack base 317.

Thus, the integrated circuit 300 of FIG. 3A may include a FinFET and a nanostructure FET on a single substrate, thereby decreasing space relative to FinFETs and nanowire FETs formed on different substrates. Additionally, the nanostructure FET may include multiple nanostructures per nanostructure stacks, which may increase current capacity compared to nanostructure FETs that include a single nanostructure per nanostructure stack.

Figure 4C:
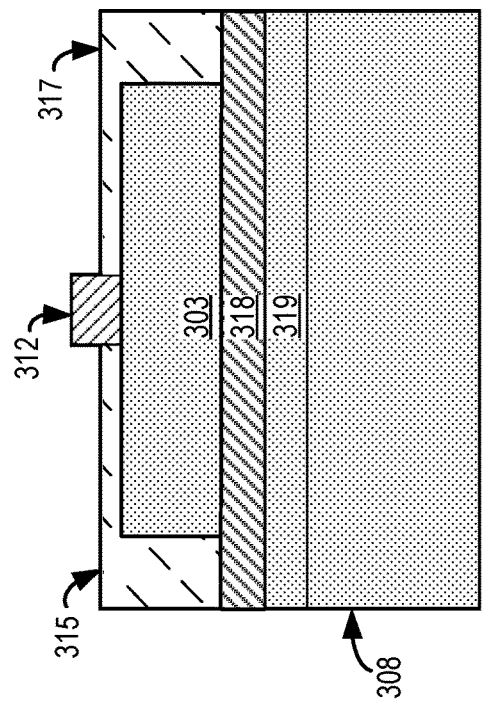
FIG. 4C is a cross-sectional view along line B of FIG. 4A.
Figure 4B:
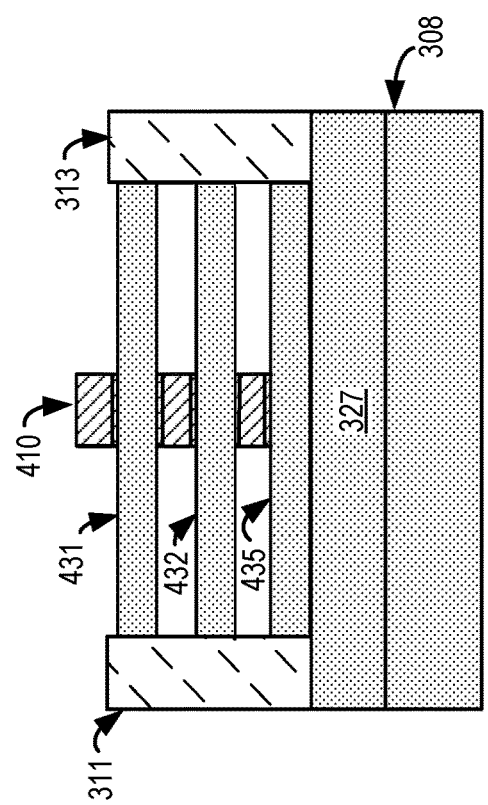
FIG. 4B is a cross-sectional view along line A of FIG. 4A.

Referring to FIGS. 4A, 4B, and 4C, an example of an integrated circuit including a nanostructure field effect transistor (FET) and a FinFET is illustrated and generally designated 400. The integrated circuit 400 includes a bulk substrate 308 of FIG. 4A. The bulk substrate 308 may be formed and structured as described above with reference to the bulk substrate 308 of FIG. 3A.

The integrated circuit 400 includes a fin field effect transistor (FinFET) 333 coupled to the bulk substrate 308. The FinFET 333 of FIG. 4A may be structured as described above with reference to the FinFET 333 of FIG. 3A and may be formed as described below with reference to FIGS. 12-15. For example, the FinFET 333 of FIG. 4A may include a fin 303 extending between a first source region 315 and a first drain region 317 of FIG. 3C.

The integrated circuit 400 further includes a nanostructure FET 406 coupled to the bulk substrate 308 of FIG. 4A. The nanostructure FET 406 includes a second source region 311 of FIG. 4B, a second drain region 313 of FIG. 4B, and a stack of at least two nanostructures extending between the second source region 311 and the second drain region 313. The nanostructure FET 406 may be formed proximate to a second region 391 of the bulk substrate 308 of FIG. 4A. The nanostructure FET 406 may be a p-type FET.

The nanostructure FET 406 may include multiple stacks of nanostructure FETs. To illustrate, the nanostructure FET 406 may include a first nanostructure FET stack 401, a second nanostructure FET stack 421, a third nanostructure FET stack 451, and a fourth nanostructure FET stack 453. Although FIG. 4A illustrates the nanostructure FET 406 as including four nanostructure FET stacks, the nanostructure FET 406 may include more than or less than four nanostructure FET stacks.

The first nanostructure FET stack 401 may include a stack of at least two nanostructures (e.g., at least three nanostructures) 431, 432, and 435 located above a portion (e.g., a nanostructure FET stack base) 327 of the bulk substrate 308 of FIG. 4A and extending between the second source region 311 and the second drain region 313 of FIG. 4B. As another example, the second nanostructure FET stack 421 may include a stack of at least two nanostructures (e.g., at least three nanostructures) 423, 424, and 425 located above a portion (e.g., a nanostructure FET stack base) 329 of the bulk substrate 308 of FIG. 4A and extending between the second source region 311 and the second drain region 313 of FIG. 4B. Additionally or alternatively, the third nanostructure FET stack 451 may include a stack of at least two nanostructures (e.g., at least three nanostructures) 471, 472, and 473 located above a portion (e.g., a nanostructure FET stack base) 316 of the bulk substrate 308 of FIG. 4A and extending between the second source region 311 and the second drain region 313 of FIG. 4B. Additionally or alternatively, the fourth nanostructure FET stack 453 may include a stack of at least two nanostructures (e.g., at least three nanostructures) 474, 475, and 476 located above a portion (e.g., a nanostructure FET stack base) 317 of the bulk substrate 308 of FIG. 4A and extending between the second source region 311 and the second drain region 313 of FIG. 4B.

One or more of the nanostructures 431, 432, 435, 423, 424, 425, 471, 472, 473, 474, 475, and 476 may be a nanowire or a nanoslab. The nanostructures 431, 432, 435, 423, 424, 425, 471, 472, 473, 474, 475, and 476 may be formed of portions of an alternating bilayer (e.g., the alternating bilayer 1201 of FIG. 12). For example, the nanostructures 431, 432, 435, 423, 424, 425, 471, 472, 473, 474, 475, and 476 may be formed of portions of the first epitaxial layer 1202, the third epitaxial layer 1206, and the fifth epitaxial layer 1210 as described in more detail below with reference to FIGS. 12-16 and 18. In some examples, the nanostructures 431, 432, 435, 423, 424, 425, 471, 472, 473, 474, 475, and 476 may be formed of the same material. Alternatively or additionally, the nanostructures 431, 432, 435, 423, 424, 425, 471, 472, 473, 474, 475, and 476 may be formed of the same material as the bulk substrate 408. In some examples, the nanostructures 431, 432, 435, 423, 424, 425, 471, 472, 473, 474, 475, and 476 are formed of silicon.

The integrated circuit 400 may include STI regions between one or more of the nanostructure FET stacks 401, 421, 451, and 453. For example, the integrated circuit 400 may include an STI region 314 between the first nanostructure FET stack 401 and the second nanostructure FET stack 421 (e.g., between the nanostructure FET stack base 427 and the nanostructure FET stack base 429). Additionally or alternatively, the integrated circuit 400 may include an STI region 383 between the second nanostructure FET stack 421 and the third nanostructure FET stack 451 (e.g., between the nanostructure FET stack base 429 and the nanostructure FET stack base 416). Additionally or alternatively, the integrated circuit 400 may include an STI region 385 between the third nanostructure FET stack 451 and the fourth nanostructure FET stack 453 (e.g., between the nanostructure FET stack base 416 and the nanostructure FET stack base 417). The STI regions 314, 383, and 385 may be formed in trenches of the bulk substrate 308 as described in more detail below.

The nanostructure FET 406 may include a gate region 410. The gate region 410 may be coupled to one or more of the STI regions 314, 383, and 385 and may surround or cover one or more portions of one or more of the nanostructures 431, 432, 435, 423, 424, 425, 471, 472, 473, 474, 475, and 476. A portions(s) of one or more of the nanostructures 431, 432, 435, 423, 424, 425, 471, 472, 473, 474, 475, and 476 proximate to (e.g., surrounded or covered by) the gate region 410 may serve as a channel region.

A top of one or more of the fins 72, 74, 76, 78, 80, or 303 may be a first distance from the bulk substrate 308 (e.g., from a top of respective portions 62, 35, 37, 39, 41, and 64), and a top of a top nanostructure of one or more of the nanostructure FET stacks 401, 421, 451, and 453 may be a second distance from the bulk substrate 308 (e.g., from a top of respective nanostructure FET stack bases 327, 329, 316, and 317). The first distance may be substantially the same as the second distance. For example, a first distance from a top of the fin 72 to a top of the portion 62 may be substantially the same as a second distance from a top of the nanostructure 474 to a top of the nanostructure FET stack base 317.

Thus, the integrated circuit 400 of FIG. 4A may include a FinFET and a nanostructure FET on a single substrate, thereby decreasing space relative to FinFETs and nanowire FETs formed on different substrates. Additionally, the nanostructure FET may include multiple nanostructures per nanostructure stacks, which may increase current capacity compared to nanostructure FETs that include a single nanostructure per nanostructure stack.

Figure 5:
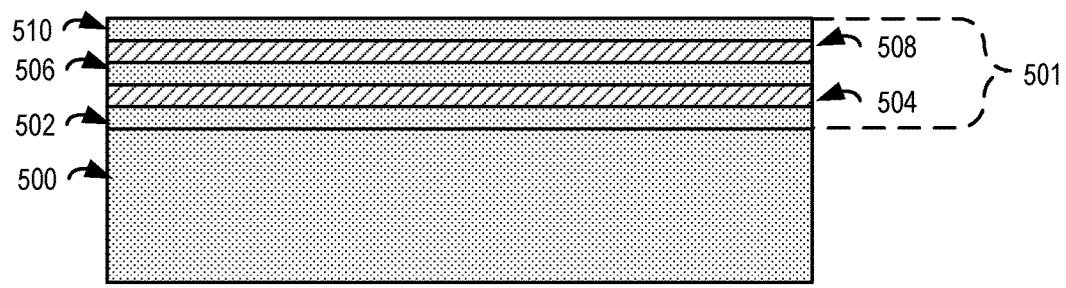
FIG. 5 illustrates a first stage during fabrication of the integrated circuit of FIG. 1A or FIG. 2A.

FIGS. 5-9 illustrate stages during fabrication of the integrated circuit 100 of FIG. 1A or the integrated circuit 200 of FIG. 2A. FIG. 5 may illustrate a first stage during fabrication of the integrated circuit 100 of FIG. 1A or the integrated circuit 200 of FIG. 2A. During the first stage of fabrication of FIG. 5, an alternating bilayer (e.g., an alternating bilayer stack) 501 may be formed on a bulk substrate 500.

The alternating bilayer 501 may be formed of multiple epitaxial layers, where each layer is formed of or includes one of two materials, and each layer is formed of a different material (of the two materials) than each neighboring layer. For example, a first epitaxial layer 502 may be formed on the bulk substrate 500, a second epitaxial layer 504 may be formed on the first epitaxial layer 502, a third epitaxial layer 506 may be formed on the second epitaxial layer 504, a fourth epitaxial layer 508 may be formed on the third epitaxial layer, and a fifth epitaxial layer 510 may be formed on the fourth epitaxial layer 508. The first, third, and fifth epitaxial layers 502, 506, and 510 may be formed of a first semiconductive material, such as silicon. In some examples, the first, third, and fifth epitaxial layers 502, 506, and 510 are formed of the same material as the bulk substrate 500. The second and fourth epitaxial layers 504 and 508 may be formed of a second material, such as silicon germanium. In some examples, each epitaxial layer of the epitaxial layers 502, 504, 506, 508, and 510 has substantially the same thickness as each other epitaxial layer of the epitaxial layers 502, 504, 506, 508, and 510. In some examples, the epitaxial layers 502, 504, 506, 508, and 510 may be formed using deposition technique, such as chemical vapor deposition (CVD).

Although the alternating bilayer 501 is illustrated as including five epitaxial layers, the alternating bilayer 501 may include more than or less than five epitaxial layers. A number of epitaxial layers of the alternating bilayer 501 may be based on a number of nanostructures per nanostructure FET stack and a type of nanostructure FET. For example, for an n-type nanostructure FET with three nanostructures per nanostructure FET stack, the alternating bilayer 501 may include six or more epitaxial layers. To illustrate, the alternating bilayer 501 may include six epitaxial layers. In this example, the first, third, and fifth epitaxial layers may be removed as described below with reference to FIG. 10, thereby suspending portions of the second, fourth, and sixth epitaxial layers that correspond to nanostructures. As another example, for a p-type nanostructure FET with two nanostructures per nanostructure FET stack, the alternating bilayer 501 may include three epitaxial layers. In this example, the second epitaxial layer may be removed as described below with reference to FIG. 11, thereby suspending portions of the first and third epitaxial layers that correspond to nanostructures.

Figure 6:
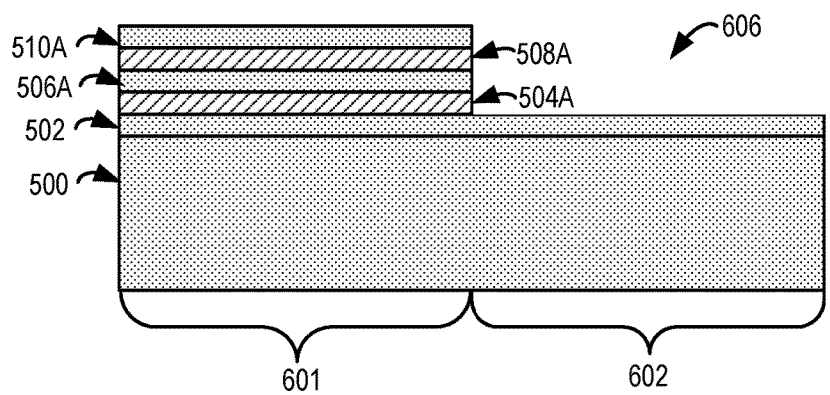
FIG. 6 illustrates a second stage during fabrication of the integrated circuit of FIG. 1A or FIG. 2A.

FIG. 6 may illustrate a second stage during fabrication of the integrated circuit 100 of FIG. 1A or the integrated circuit 200 of FIG. 2A. The second stage of FIG. 6 may be subsequent to the first stage of FIG. 5. During the second stage of fabrication of FIG. 6, portions of one or more layers of the alternating bilayer 501 of FIG. 5 proximate to a first region 602 of the bulk substrate 500 may be removed to form an opening 606. The location of the first region 602 of the bulk substrate 500 may correspond to the location of the first region 193 of the bulk substrate 108 of FIG. 1A or to the location of the first region 293 of the bulk substrate 208 of FIG. 2A. For example, portions of the second, third, fourth, and fifth epitaxial layers 504, 506, 508, and 510 proximate to the first region 602 of the bulk substrate 500 may be removed. Remaining portions of the second, third, fourth, and fifth epitaxial layers 504, 506, 508, and 510 may be referred to as modified second, modified third, modified fourth, and modified fifth epitaxial layers 504a, 506a, 508a, and 510a, respectively.

In some examples, the portions of the one or more layers of the alternating bilayer 501 may be removed using an etch process guided using a patterned photoresist [not illustrated] located on the fifth epitaxial layer 510 of FIG. 5. The patterned photoresist may have an opening at a location corresponding to the location of the opening 606. The fifth epitaxial layer 510 may be etched through the opening in the patterned photoresist to form the opening 606.

FIG. 7 may illustrate a third stage during fabrication of the integrated circuit 100 of FIG. 1A or the integrated circuit 200 of FIG. 2A. The third stage of FIG. 7 may be subsequent to the second stage of FIG. 6. During the third stage of fabrication of FIG. 7, a fill layer 702 is formed in the opening 606 of FIG. 6. In some examples, the fill layer 702 is formed of or includes silicon. In some examples, the fill layer 702 is formed using a deposition technique (such as CVD)

followed by a planarization technique (such as a chemical mechanical planarization technique).

Figure 8:
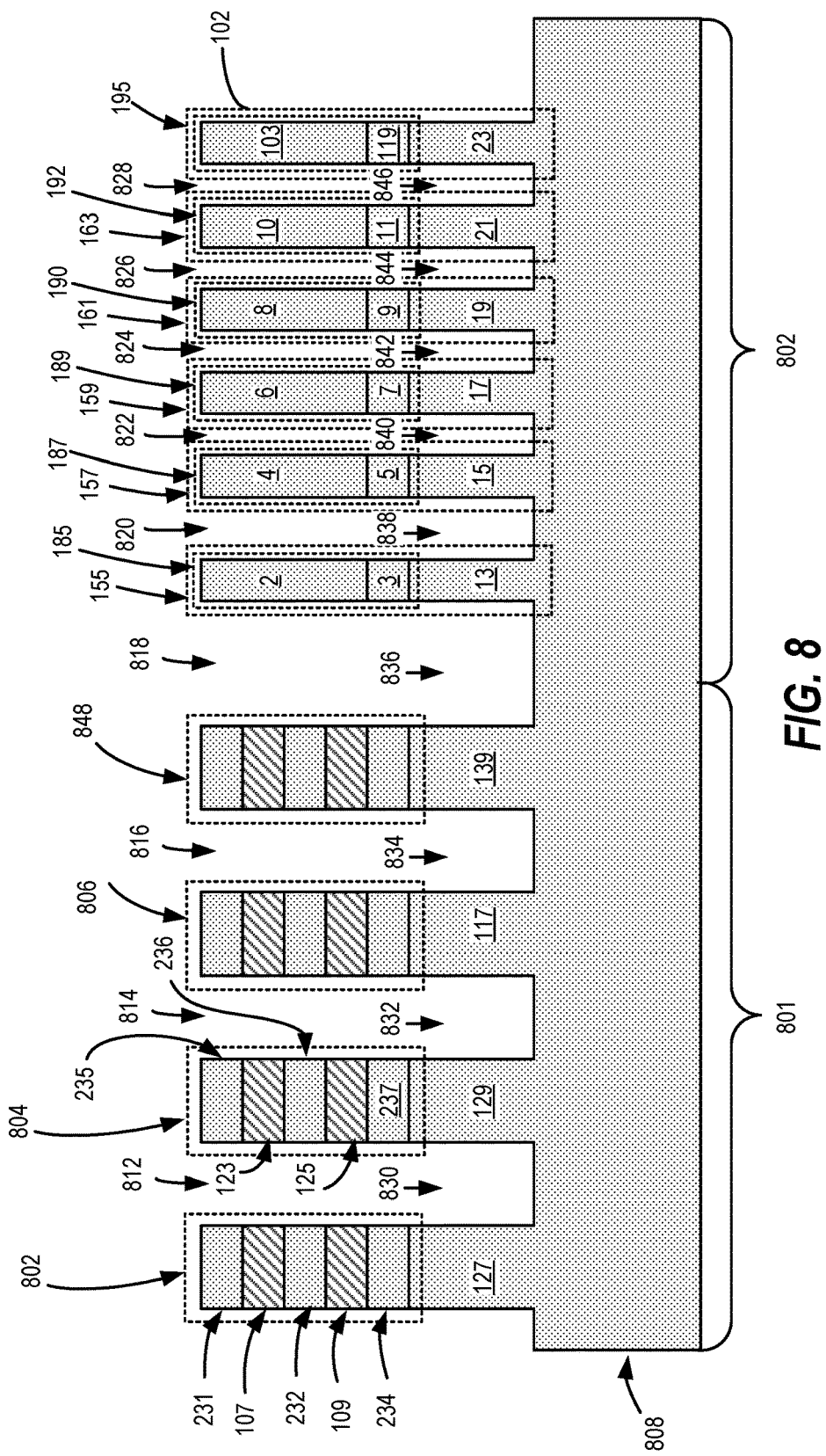
FIG. 8 illustrates a fourth stage during fabrication of the integrated circuit of FIG. 1A or FIG. 2A.

FIG. 8 may illustrate a fourth stage during fabrication of the integrated circuit 100 of FIG. 1A or the integrated circuit 200 of FIG. 2A. The fourth stage of FIG. 8 may be subsequent to the third stage of FIG. 7. During the fourth stage of fabrication of FIG. 8, openings are formed in portions of the alternating bilayer 501 of FIG. 5 that remain after the third stage of FIG. 7 and that are proximate to the second region 601 of the bulk substrate 500 of FIG. 8. For example, openings may be formed in the first epitaxial layer 502 and the second modified, third modified, fourth modified, and fifth modified epitaxial layers 504a, 506a, 508a, and 510a of FIG. 7. Additionally, during the fourth stage of fabrication of FIG. 8, openings are formed in portions of the fill layer 702 of FIG. 7 and the first epitaxial layer 502 proximate to the first region 602 of the bulk substrate 500. For example, openings 812, 814, 816, 818, 820, 822, 824, 1526, and 828 may be formed during the fourth stage.

The openings 812, 814, and 816 and a portion of the opening 818 may be formed by removing portions of the alternating bilayer 501 that remain subsequent to the third stage and that are proximate to the second region 601 of the bulk substrate 500 to form one or more stacks of portions of the alternating bilayer 501. For example, portions of the first, modified second, modified third, modified fourth, and modified fifth epitaxial layers 502, 504, 506a, 508a, and 510a proximate to the second region 601 of the bulk substrate 500 may be removed to form a first stack 802, a second stack 804, a third stack 806, and a fourth stack 848.

Each of the stacks 802, 804, 806, and 848 may be formed of stacked nanostructures. For example, the stack 802 may be formed of the nanostructure 234 of FIG. 2A, the nanostructure 109 of FIG. 1A, the nanostructure 232 of FIG. 2A, the nanostructure 107 of FIG. 1A, and the nanostructure 231 of FIG. 2A. As another example, the stack 804 may be formed of the nanostructure 237 of FIG. 2A, the nanostructure 125 of FIG. 1A, the nanostructure 236 of FIG. 2A, the nanostructure 123 of FIG. 1A, and the nanostructure 235 of FIG. 2A. As another example, the stack 806 may be formed of the nanostructure 273 of FIG. 2A, the nanostructure 173 of FIG. 1A, the nanostructure 272 of FIG. 2A, the nanostructure 171 of FIG. 1A, and the nanostructure 271 of FIG. 2A. As another example, the stack 808 may be formed of the nanostructure 276 of FIG. 2A, the nanostructure 177 of FIG. 1A, the nanostructure 275 of FIG. 2A, the nanostructure 175 of FIG. 1A, and the nanostructure 274 of FIG. 2A.

Additionally or alternatively, the second portion of the opening 818 and the openings 820, 822, 824, 826, and 828 may be formed by removing portions of the fill layer 702 of FIG. 7 and portions of the first epitaxial layer 502 proximate to the first region 602 of the bulk substrate 500.

Additionally, during the fourth stage of fabrication of FIG. 8, trenches are formed in the first and second regions 602 and 601 of FIG. 7 of the bulk substrate 500. For example, trenches 830, 832, 834, 836, 838, 840, 842, 844, and 846 may be formed during the fourth stage of fabrication.

The trenches 830, 832, 834, and a first portion of the trench 836 may be formed by etching portions of the second region 601 of the bulk substrate 500 of FIG. 7, and the trenches 838, 840, 842, 844, and 846 and a second portion of the trench 836 may be formed by etching portions of the first region 602 of the bulk substrate 500 of FIG. 7.

In some examples, the openings 812, 814, 816, 818, 820, 822, 824, 826, and 828, and the trenches 830, 832, 834, 836, 838, 840, 842, 844, and 846 are formed using an etch process. For example, a patterned photoresist [not illustrated] may be formed on the modified fifth epitaxial layer 510a and on the fill layer 702 of FIG. 7 with openings at locations corresponding to the locations of the openings 812, 814, 816, 818, 820, 822, 824, 826, and 828. Portions of the alternating bilayer 501 of FIG. 5 that remain after the third stage and that are proximate to the second region 601 of the bulk substrate 500 of FIG. 6, portions of the second region 601 of the bulk substrate 500, portions of the fill layer 702 and the first epitaxial layer 502 proximate to the first region 602 of the bulk substrate 500, and portions of the first region 602 of the bulk substrate 500 may be etched through the openings in the patterned photoresist, thereby forming the openings 812, 814, 816, 818, 820, 822, 824, 826, and 828, and the trenches 830, 832, 834, 836, 838, 840, 842, 844, and 846.

Figure 9:
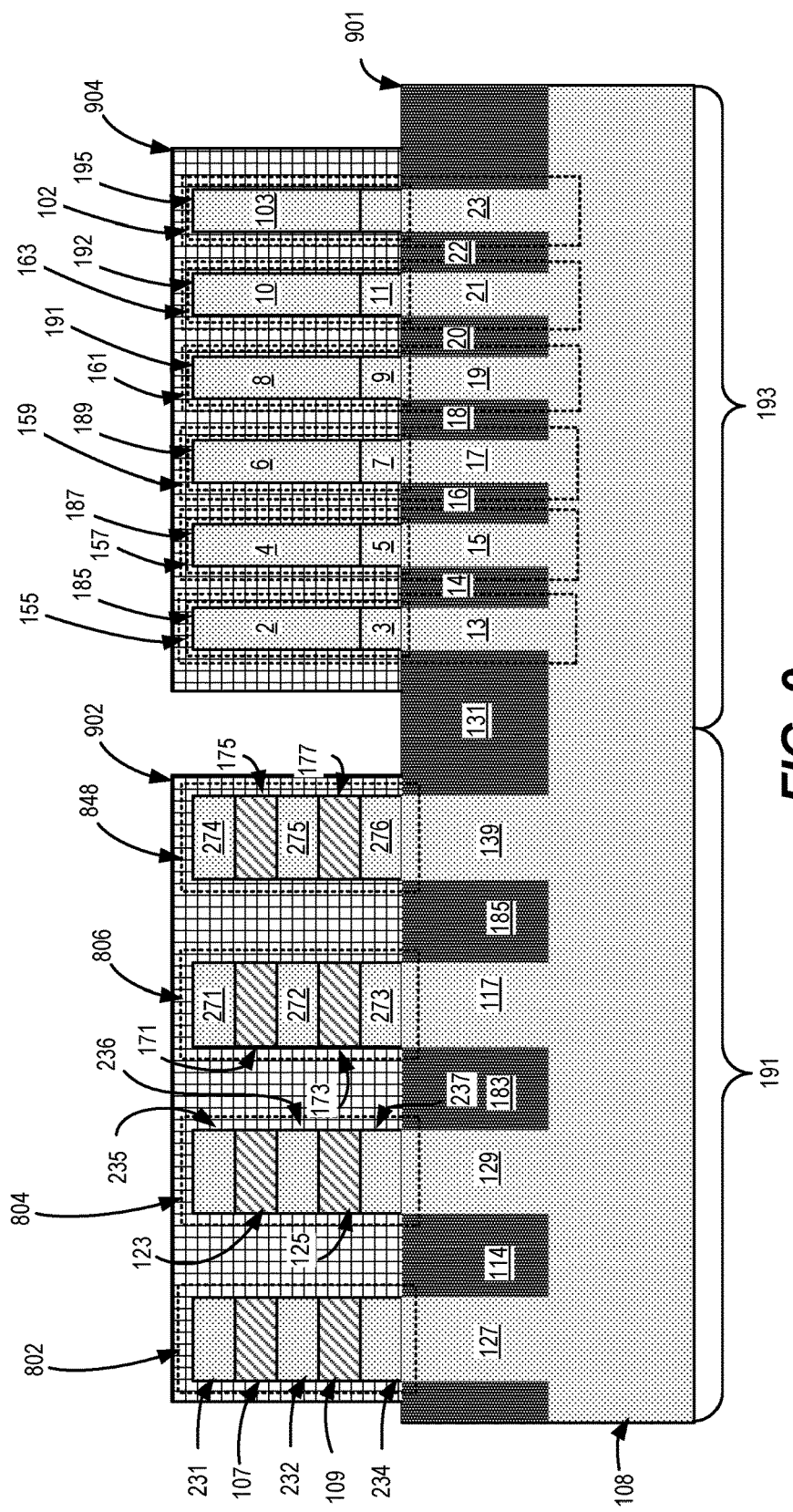
FIG. 9 illustrates a fifth stage during fabrication of the integrated circuit of FIG. 1A or FIG. 2A.

FIG. 9 may illustrate a fifth stage during fabrication of the integrated circuit 100 of FIG. 1A or the integrated circuit 200 of FIG. 2A. The fifth stage of FIG. 9 may be subsequent to the fourth stage of FIG. 8. During the fifth stage of fabrication of FIG. 9, STI material is formed in the trenches formed during the fourth stage of fabrication and dummy gates are formed proximate to the first region 191 and the second region 193 of the bulk substrate 108.

For example, during the fifth stage of fabrication, STI material 901 may be deposited in the trenches 830, 832, 834, 836, 838, 840, 842, 844, and 846 of FIG. 8 to form STI regions 114, 183, 185, 131, 14, 16, 18, 20, and 22 of FIG. 9. In some examples, the STI material 901 may be deposited using a deposition technique, such as CVD.

Subsequent to forming the STI regions 114, 183, 185, 131, 14, 16, 18, 20, and 22 of FIG. 9, dummy gates 904 and 902 may be formed proximate to the first region 193 and the second region 191 of the bulk substrate 108, respectively.

Figure 10:
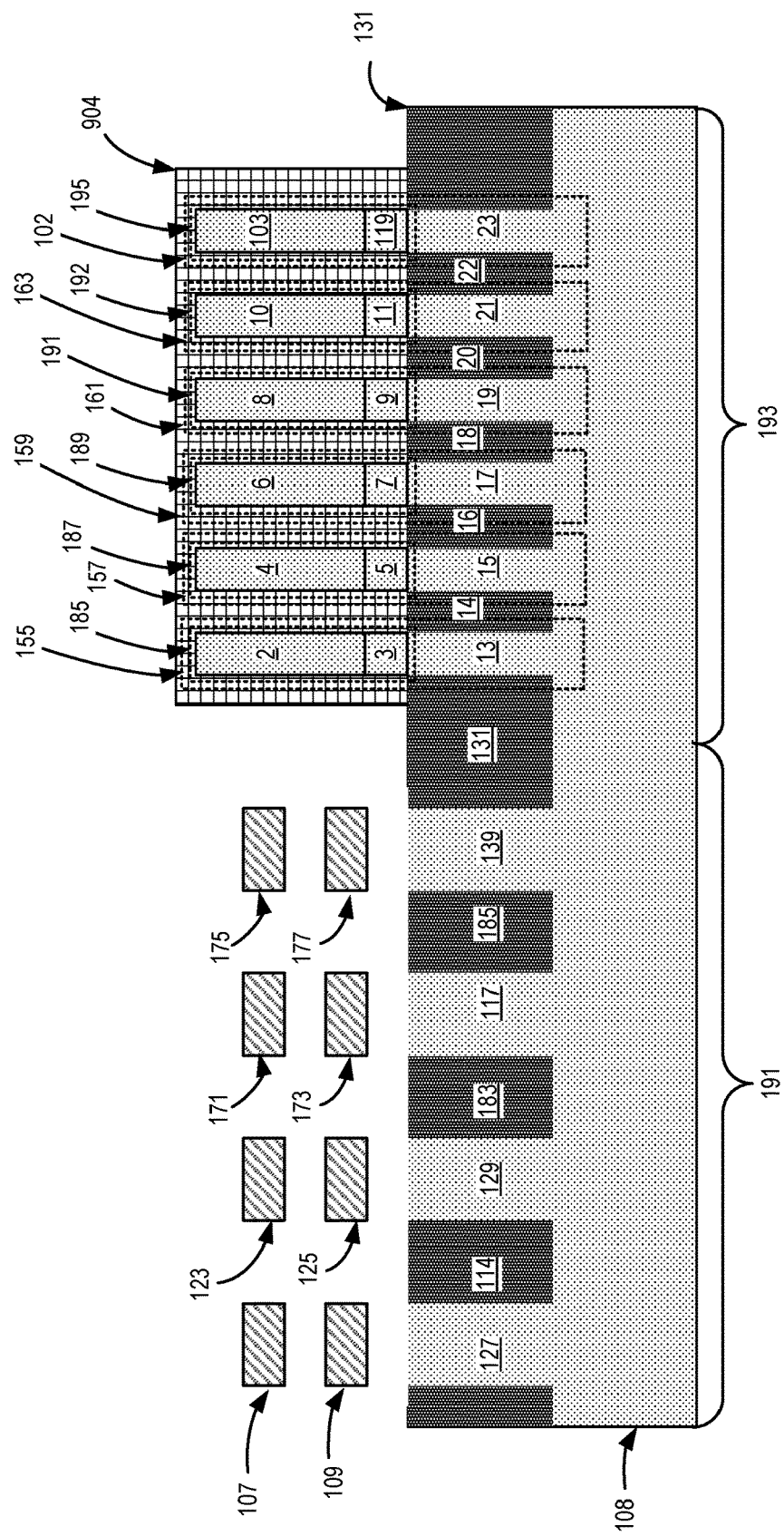
FIG. 10 illustrates a sixth stage during fabrication of the integrated circuit of FIG. 1A.

FIG. 10 may illustrate a sixth stage during fabrication of the integrated circuit 100 of FIG. 1A. The sixth stage of FIG. 10 may be subsequent to the fifth stage of FIG. 9. During the sixth stage of FIG. 10, the dummy gate 902 of FIG. 9 proximate to the second region 191 of the bulk substrate 108 is removed and one or more nanostructures are removed from one or more of the stacks 802, 804, 806, or 848 of FIG. 9.

The dummy gate 902 may be removed using an etch process. For example, a photoresist [not illustrated] may be formed on the dummy gate 902 and the dummy gate 904. The photoresist may be patterned with an opening at a location corresponding to the location of the second region 191 of the bulk substrate 108 (e.g., at a location corresponding to the dummy gate 902 of FIG. 9). The dummy gate 902 may be etched through the opening and the photoresist may prevent the dummy gate 904 from being etched.

Subsequent to removing the dummy gate 902, portions of the first epitaxial layer 502, the modified third epitaxial layer 506a, and the modified fifth epitaxial layer 510a that remain after the fifth stage and that are proximate to the second region 191 of the bulk substrate 108 may be removed. For example, the nanostructures 234, 232, and 231 may be removed from the stack 802 of FIG. 9, thereby suspending the at least two nanostructures 109 and 107. As another example, the nanostructures 237, 236, and 235 may be removed from the stack 804 of FIG. 9, thereby suspending the at least two nanostructures 125 and 123. As another example, the nanostructures 273, 272, and 271 may be removed from the stack 806 of FIG. 9, thereby suspending the at least two nanostructures 173 and 171. As another example, the nanostructures 276, 275, and 274 may be removed from the stack 848 of FIG. 9, thereby suspending the at least two nanostructures 177 and 175. The nanostructures 234, 232, 231, 237, 236, 235, 273, 272, 271, 276, 275, and 274 may be removed using an etching technique.

FIG. 1A may illustrate a seventh stage during fabrication of the integrated circuit 100. The seventh stage of FIG. 1A may be subsequent to the sixth stage of FIG. 10. During the seventh stage of fabrication of FIG. 1A, the dummy gate 904 of FIG. 10 may be removed using an etching technique and gate regions 110 and 112 may be formed. The gate regions 110 and 112 may be formed using a deposition technique, such as CVD.

Figure 11:
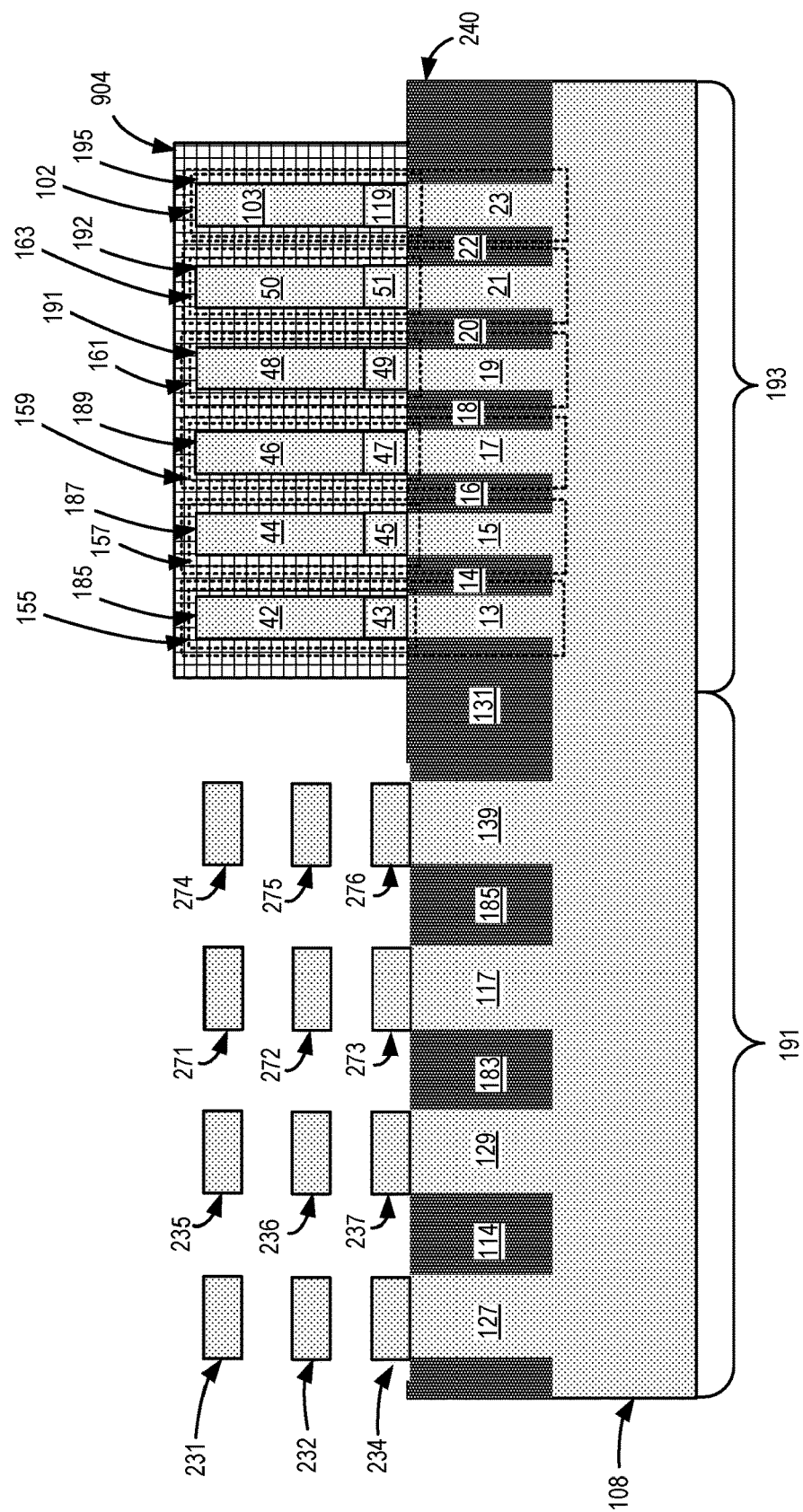
FIG. 11 illustrates a sixth stage during fabrication of the integrated circuit of FIG. 2A.

FIG. 11 may illustrate a sixth stage during fabrication of the integrated circuit 200 of FIG. 2A. The sixth stage of FIG. 11 may be subsequent to the fifth stage of FIG. 9. During the sixth stage of FIG. 11, the dummy gate 902 of FIG. 9 proximate to the second region 191 of the bulk substrate 108 is removed and one or more nanostructures are removed from one or more of the stacks 802, 804, 806, and 808 of FIG. 9.

The dummy gate 902 may be removed using an etch process. For example, a photoresist [not illustrated] may be formed on the dummy gate 902 and the dummy gate 904. The photoresist may be patterned with an opening at a location corresponding to the location of the second region 191 of the bulk substrate 108 (e.g., at a location corresponding to the dummy gate 902). The dummy gate 902 may be etched through the opening and the photoresist may prevent the dummy gate 904 from being etched.

Subsequent to removing the dummy gate 902, portions of the modified second epitaxial layer 504a and the modified fourth epitaxial layer 508a that remain after the fifth stage and that are proximate to the second region 191 of the bulk substrate 108 may be removed. For example, the nanostructures 107 and 109 may be removed from the stack 802 of FIG. 9, thereby suspending the at least two nanostructures 234, 232, and 231. As another example, the nanostructures 125 and 123 may be removed from the stack 804 of FIG. 9, thereby suspending the at least two nanostructures 237, 236, and 235. As another example, the nanostructures 173 and 171 may be removed from the stack 806 of FIG. 9, thereby suspending the at least two nanostructures 273, 272, and 271. As another example, the nanostructures 177 and 175 may be removed from the stack 808 of FIG. 9, thereby suspending the at least two nanostructures 276, 275, and 274. The nanostructures 107, 109, 125, 123, 173, 171, 177, and 175 may be removed using an etching technique.

FIG. 2A may illustrate a seventh stage during fabrication of the integrated circuit 200. The seventh stage of FIG. 2A may be subsequent to the sixth stage of FIG. 11. During the seventh stage of fabrication of FIG. 2A, the dummy gate 904 of FIG. 11 may be removed using an etching technique and gate regions 210 and 212 may be formed. The gate regions 210 and 212 may be formed using a deposition technique, such as CVD.

FIGS. 12-16 illustrate stages during fabrication of the integrated circuit 300 of FIG. 3A or the integrated circuit 400 of FIG. 4A. FIG. 12 may illustrate a first stage during fabrication of the integrated circuit 300 of FIG. 3A or the integrated circuit 400 of FIG. 4A. During the first stage of fabrication of FIG. 12, an alternating bilayer (e.g., an alternating bilayer stack) 1201 may be formed on a bulk substrate 1200. The bulk substrate 1200 may correspond to or may be structured as described above with reference to the bulk substrate 500 of FIG. 5 and the alternating bilayer 1201 of FIG. 12 may correspond to or may be structured as described above with reference to the alternating bilayer 501 of FIG. 5. The bulk substrate 1200 may be etched to form the bulk substrate 308 of FIG. 3A or the bulk substrate 308 of FIG. 4A as described in more detail below with reference to FIG. 15.

The alternating bilayer 1201 may be formed of multiple epitaxial layers as described above with reference to FIG. 5. For example, a first epitaxial layer 1202 may be formed as described above with reference to the first epitaxial layer 502 of FIG. 5, a second epitaxial layer 1204 may be formed as described above with reference to the second epitaxial layer 504 of FIG. 5, a third epitaxial layer 1206 may be formed as described above with reference to the third epitaxial layer 506 of FIG. 5, a fourth epitaxial layer 1208 may be formed as described above with reference to the fourth epitaxial layer 508 of FIG. 5, and a fifth epitaxial layer 1210 may be formed as described above with reference to the fifth epitaxial layer 510 of FIG. 5.

FIG. 13 may illustrate a second stage during fabrication of the integrated circuit 300 of FIG. 3A or the integrated circuit 400 of FIG. 4A. The second stage of FIG. 13 may be subsequent to the first stage of FIG. 12. During the second stage of fabrication of FIG. 13, portions of one or more layers of the alternating bilayer 1201 of FIG. 12 proximate to a first region 1393 of the bulk substrate 1200 may be removed to form an opening 1302. For example, portions of the third, fourth, and fifth epitaxial layers 1206, 1208, and 1210 of FIG. 12 proximate to the first region 1393 of the bulk substrate 1200 may be removed, resulting in a modified third epitaxial layer 1206a, a modified fourth epitaxial layer 1208a, and a modified fifth epitaxial layer 1210a.

In some examples, the portions of the one or more layers of the alternating bilayer 1201 may be removed using an etch process. For example, a patterned photoresist [not illustrated] having an opening at a location corresponding to the location of the opening 1302 may be formed on the fifth epitaxial layer 1210 of FIG. 12. The fifth epitaxial layer 1210 may be etched through the opening to form the opening 1302 of FIG. 13.

FIG. 14 may illustrate a third stage during fabrication of the integrated circuit 300 of FIG. 3A or the integrated circuit 400 of FIG. 4A. The third stage of FIG. 14 may be subsequent to the second stage of FIG. 13. During the third stage of fabrication of FIG. 14, a fill layer 1402 is formed in the opening 1302 of FIG. 13. In some examples, the fill layer 1402 is formed of or includes silicon. In some examples, the fill layer 1402 is formed by a deposition technique, such as CVD, followed by a planarization technique (such as a chemical mechanical planarization technique).

Figure 15:
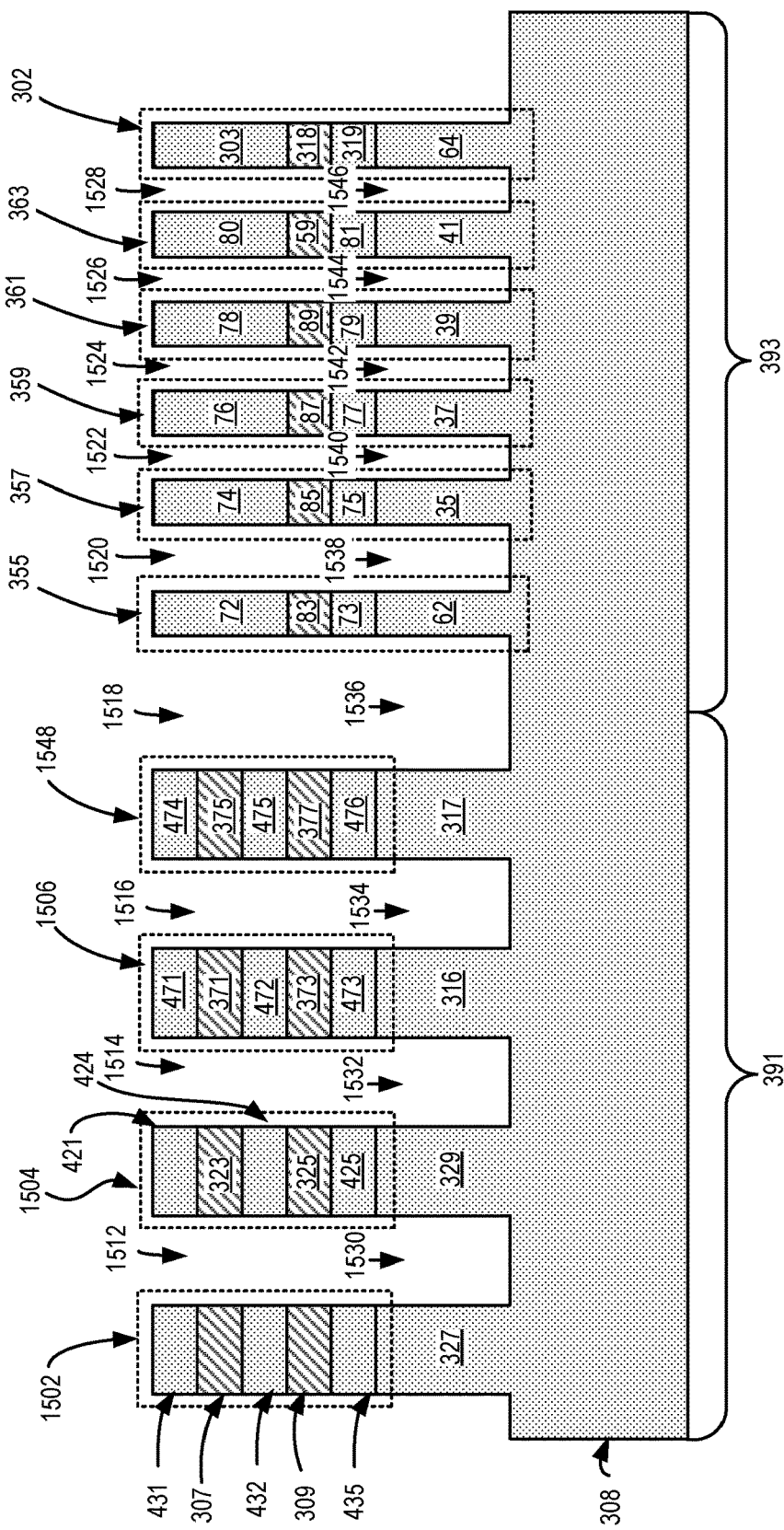
FIG. 15 illustrates a fourth stage during fabrication of the integrated circuit of FIG. 3A or FIG. 4A.

FIG. 15 may illustrate a fourth stage during fabrication of the integrated circuit 300 of FIG. 3A or the integrated circuit 400 of FIG. 4A. The fourth stage of FIG. 15 may be subsequent to the third stage of FIG. 14. During the fourth stage of fabrication of FIG. 15, openings are formed in portions of the alternating bilayer 1201 of FIG. 12 that remain after the third stage and that are proximate to the second region 1391 of the bulk substrate 1200 of FIG. 13. For example, openings may be formed in the first and second epitaxial layers 1202 and 1204 and the third, fourth, and fifth modified epitaxial layers 1206a, 1208a, and 1210a. Additionally, openings are formed in portions of the fill layer 1402 of FIG. 14 and the first and second epitaxial layers 1202 and 1204 proximate to the first region 1393 of the bulk substrate 1200. For example, openings 1512, 1514, 1516, 1518, 1520, 1522, 1524, 1526, and 1528 may be formed.

The openings 1512, 1514, 1516, and a first portion of the opening 1518 may be formed by removing portions of the alternating bilayer 1201 remaining subsequent to the third stage proximate to the second region 1391 of the bulk substrate 1200 to form one or more stacks of portions of the alternating bilayer 1201 remaining subsequent to the third stage. For example, portions of the first, second, modified third, modified fourth, and modified fifth epitaxial layers 1202, 1204, 1206a, 1208a, and 1210a proximate to the second region 1391 of the bulk substrate 1200 may be removed to form a first stack 1502, a second stack 1504, a third stack 1506, and a fourth stack 1508.

Each of the stacks 1502, 1504, 1506, and 1548 may be formed of stacked nanostructures. For example, the stack 1502 may be formed of the nanostructure 435 of FIG. 4A, the nanostructure 309 of FIG. 3A, the nanostructure 432 of FIG. 4A, the nanostructure 307 of FIG. 3A, and the nanostructure 431 of FIG. 4A. As another example, the stack 1504 may be formed of the nanostructure 425 of FIG. 4A, the nanostructure 325 of FIG. 3A, the nanostructure 424 of FIG. 4A, the nanostructure 323 of FIG. 3A, and the nanostructure 421 of FIG. 4A. As another example, the stack 1506 may be formed of the nanostructure 473 of FIG. 4A, the nanostructure 373 of FIG. 3A, the nanostructure 472 of FIG. 4A, the nanostructure 371 of FIG. 3A, and the nanostructure 471 of FIG. 4A. As another example, the stack 1508 may be formed of the nanostructure 476 of FIG. 4A, the nanostructure 377 of FIG. 3A, the nanostructure 475 of FIG. 4A, the nanostructure 375 of FIG. 3A, and the nanostructure 474 of FIG. 4A.

Additionally or alternatively, the second portion of the opening 1518 and the openings 1520, 1522, 1524, 1526, and 1528 may be formed by removing portions of the fill layer 1402 of FIG. 14 and portions of the first epitaxial layer 1202 and the second epitaxial layer 1204 proximate to the first region 1393 of the bulk substrate 1200.

Additionally, during the fourth stage of FIG. 15, trenches may be formed in the bulk substrate 1200 of FIG. 14. For example, trenches 1530, 1532, 1534, 1536, 1538, 1540, 1542, 1544, and 1546 may be formed in the bulk substrate 1200 of FIG. 14, resulting in the bulk substrate 308.

The trenches 1530, 1532, 1534, and a first portion of the trench 1536 may be formed by etching portions of the second region 1391 of the bulk substrate 1200 of FIG. 14. The trenches 1538, 1540, 1542, 1544, and 1546 and a second portion of the trench 1536 may be formed by etching portions of the first region 1393 of the bulk substrate 1200 of FIG. 14.

In some examples, the openings 1512, 1514, 1516, 1518, 1520, 1522, 1524, 1526, and 1528, and the trenches 1530, 1532, 1534, 1536, 1538, 1540, 1542, 1544, and 1546 are formed using an etch process. For example, a patterned photoresist [not illustrated] may be formed on the modified fifth epitaxial layer 1210a of FIG. 14 and on the fill layer 1402. The patterned photoresist may include openings at locations corresponding to the locations of the openings 1512, 1514, 1516, 1518, 1520, 1522, 1524, 1526, and 1528. Portions of the alternating bilayer 1201 that remain after the third stage and that are proximate to the second region 1391 of the bulk substrate 1200 of FIG. 14; portions of the second region 1391 of the bulk substrate 1200; portions of the fill layer 1402, the first epitaxial layer 1202 and the second epitaxial layer 1204 proximate to the first region 1393 of the bulk substrate 1200; and portions of the first region 1393 of the bulk substrate 1200 may be etched through the openings in the patterned photoresist, thereby forming the openings 1512, 1514, 1516, 1518, 1520, 1522, 1524, 1526, and 1528, and the trenches 1530, 1532, 1534, 1536, 1538, 1540, 1542, 1544, and 1546.

Figure 16:
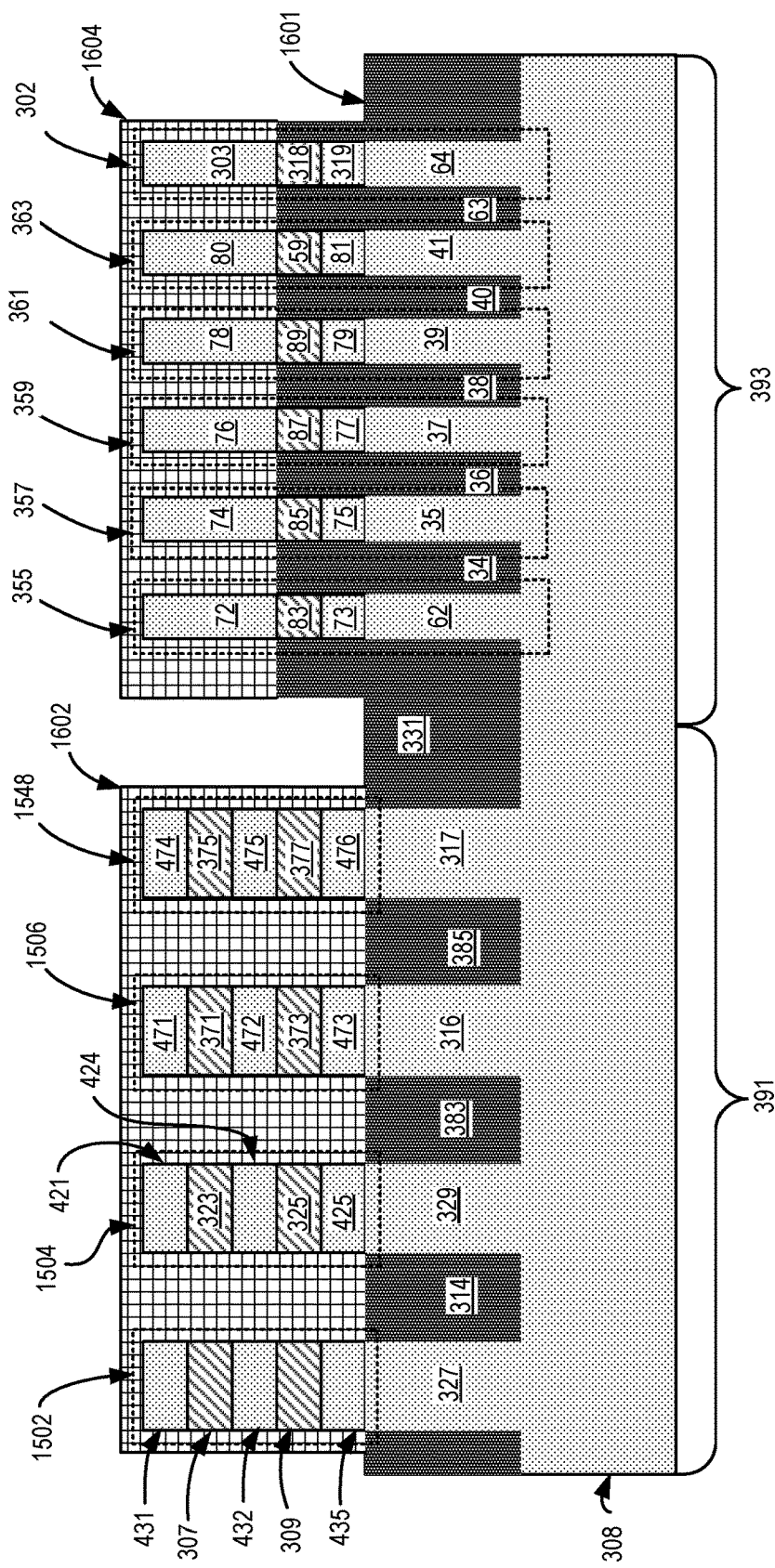
FIG. 16 illustrates a fifth stage during fabrication of the integrated circuit of FIG. 3A or FIG. 4A.

FIG. 16 may illustrate a fifth stage during fabrication of the integrated circuit 300 of FIG. 3A or the integrated circuit 400 of FIG. 4A. The fifth stage of FIG. 16 may be subsequent to the fourth stage of FIG. 15. During the fifth stage of fabrication of FIG. 16, STI material is formed in the trenches formed during the fourth stage of fabrication and dummy gates are formed proximate to the first region 393 and the second region 391 of the bulk substrate 308.

For example, during the fifth stage of fabrication, STI material 1601 may be deposited in the trenches 1530, 1532, 1534, 1536, 1538, 1540, 1542, 1544, and 1546 of FIG. 15 to form STI regions 314, 383, 385, 331, 34, 36, 38, 40, and 63 of FIG. 16. In some examples, the STI material 1601 may be deposited using a deposition technique, such as CVD.

Subsequent to forming the STI regions 314, 383, 385, 331, 34, 36, 38, 40, and 63, dummy gates 1604 and 1602 may be formed proximate to the first region 393 and the second region 391 of the bulk substrate 308, respectively.

Figure 17:
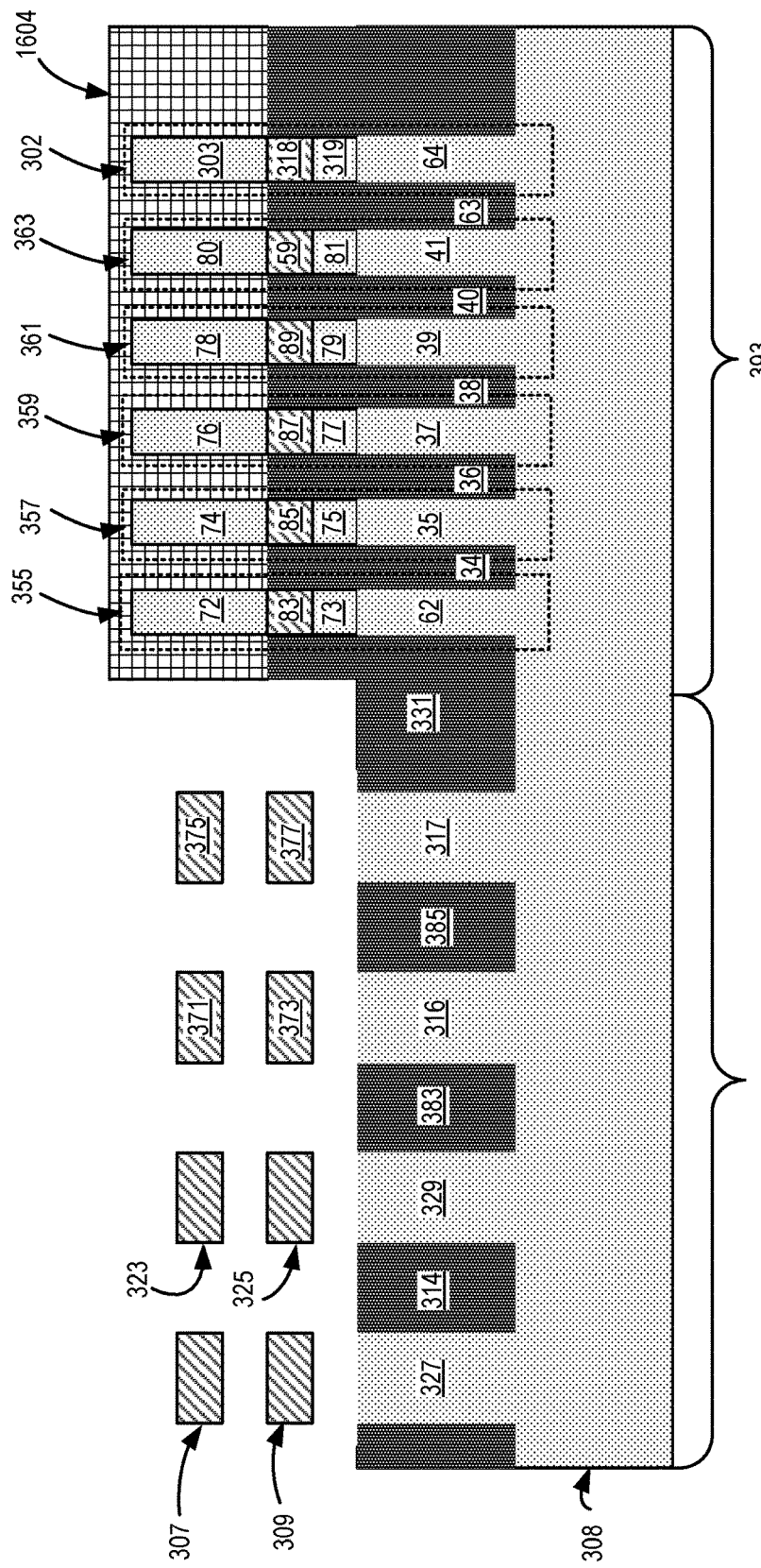
FIG. 17 illustrates a sixth stage during fabrication of the integrated circuit of FIG. 3A.

FIG. 17 may illustrate a sixth stage during fabrication of the integrated circuit 300 of FIG. 3A. The sixth stage of FIG. 17 may be after the fifth stage of FIG. 16. During the sixth stage of FIG. 17, the dummy gate 1602 of FIG. 16 proximate to the second region 391 of the bulk substrate 308 is removed and one or more nanostructures are removed from one or more of the stacks 1502, 1504, 1506, and 1548 of FIG. 16.

The dummy gate 1602 may be removed using an etch process. For example, a patterned photoresist [not illustrated] may be formed on the dummy gate 1602 and the dummy gate 1604. The patterned photoresist may include an opening at a location corresponding to the location of the second region 391 of the bulk substrate 308 (e.g., at a location corresponding to the dummy gate 1602 of FIG. 16). The dummy gate 1602 may be etched through the opening and the photoresist may prevent the dummy gate 1604 from being etched.

Subsequent to removing the dummy gate 1602, remaining portions of the first, third, and fifth epitaxial layers proximate to the second region 391 of the bulk substrate 308 may be removed. For example, the nanostructures 435, 432, and 431 may be removed from the stack 1502 of FIG. 16, thereby suspending the at least two nanostructures 309 and 307. As another example, the nanostructures 425, 424, and 421 may be removed from the stack 1504 of FIG. 16, thereby suspending the at least two nanostructures 325 and 323. As another example, the nanostructures 473, 472, and 471 may be removed from the stack 1506 of FIG. 16, thereby suspending the at least two nanostructures 373 and 371. As another example, the nanostructures 476, 475, and 474 may be removed from the stack 1548 of FIG. 16, thereby suspending the at least two nanostructures 377 and 375. The nanostructures 435, 432, 431, 425, 424, 421, 473, 472, 471, 476, 475, and 474 may be removed using an etching technique.

FIG. 3A may illustrate a seventh stage during fabrication of the integrated circuit 300. The seventh stage of FIG. 3A may be subsequent to the sixth stage of FIG. 17. During the seventh stage of fabrication of FIG. 3A, the dummy gate 1604 of FIG. 17 may be removed using an etching technique and gate regions 310 and 312 may be formed. The gate regions 310 and 312 may be formed using a deposition technique, such as CVD.

Figure 18:
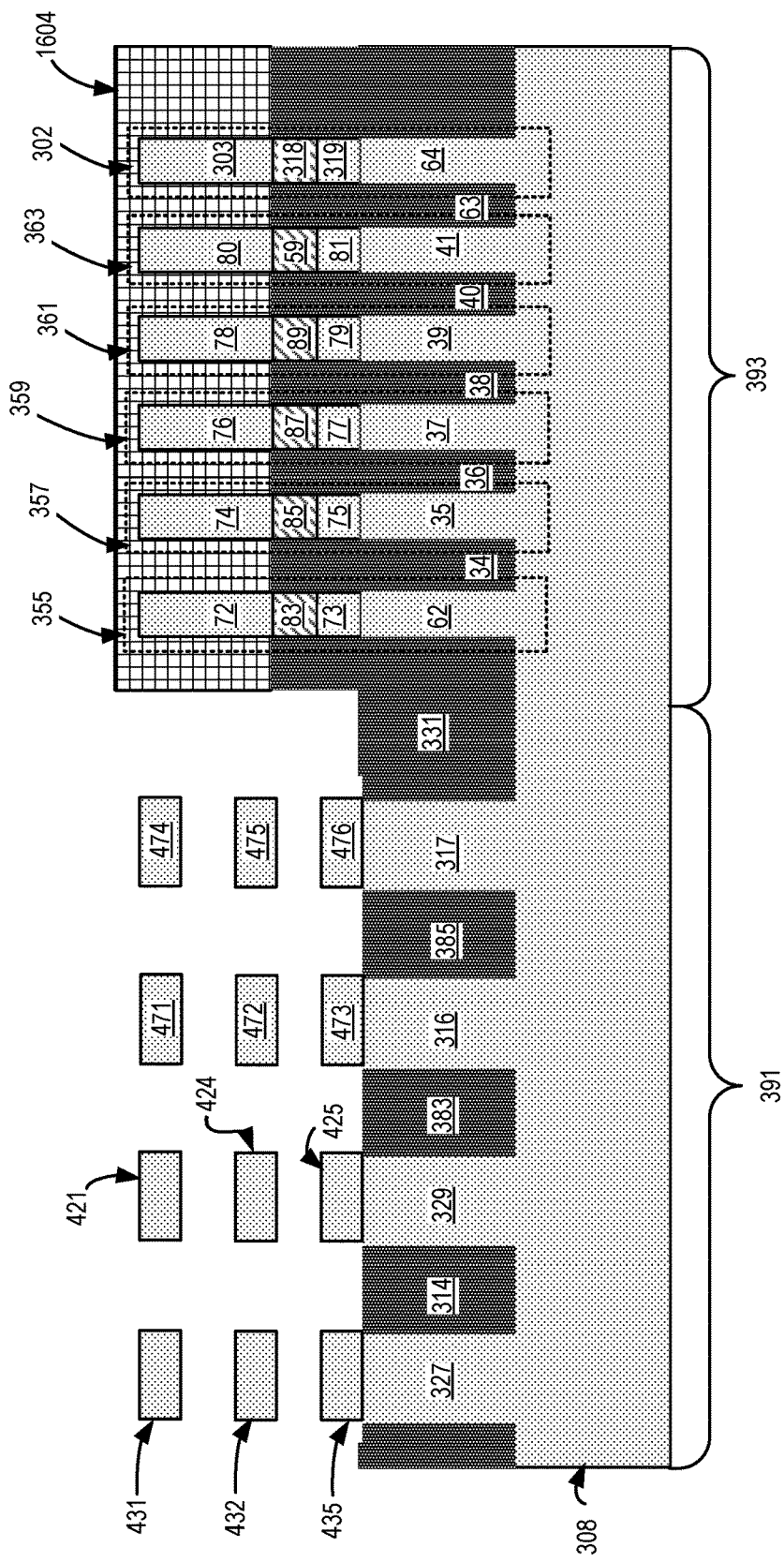
FIG. 18 illustrates a sixth stage during fabrication of the integrated circuit of FIG. 4A.

FIG. 18 may illustrate a sixth stage during fabrication of the integrated circuit 400 of FIG. 4A. The sixth stage of FIG. 18 may be subsequent to the fifth stage of FIG. 16. During the sixth stage of FIG. 18, the dummy gate 1602 of FIG. 16 proximate to the second region 391 of the bulk substrate 308 is removed and one or more nanostructures are removed from one or more of the stacks 1502, 1504, 1506, and 1548 of FIG. 16.

The dummy gate 1602 may be removed using an etch process. For example, a patterned photoresist [not illustrated] may be formed on the dummy gate 1602 and the dummy gate 1604. The patterned photoresist may include an opening at a location corresponding to the location of the second region 391 of the bulk substrate 308 (e.g., at a location corresponding to the dummy gate 1602). The dummy gate 1602 may be etched through the opening in the patterned photoresist and the photoresist may prevent the dummy gate 1604 from being etched.

Subsequent to removing the dummy gate 1602, remaining portions of the second and fourth epitaxial layers proximate to the second region 391 of the bulk substrate 308 may be removed. For example, the nanostructures 307 and 309 may be removed from the stack 1502 of FIG. 16, thereby suspending the at least two nanostructures 435, 432, and 431. As another example, the nanostructures 325 and 323 may be removed from the stack 1504 of FIG. 16, thereby suspending the at least two nanostructures 425, 424, and 421. As another example, the nanostructures 373 and 371 may be removed from the stack 1506 of FIG. 16, thereby suspending the at least two nanostructures 473, 472, and 471. As another example, the nanostructures 377 and 375 may be removed from the stack 1548 of FIG. 16, thereby suspending the at least two nanostructures 476, 475, and 474. The nanostructures 307, 309, 325, 323, 373, 371, 377, and 375 may be removed using an etching technique.

FIG. 4A may illustrate a seventh stage during fabrication of the integrated circuit 400. During the seventh stage of fabrication of FIG. 4A, the dummy gate 1604 of FIG. 18 may be removed using an etching technique and gate regions 410 and 412 may be formed. The gate regions 410 and 412 may be formed using a deposition technique, such as CVD.

Figure 19:
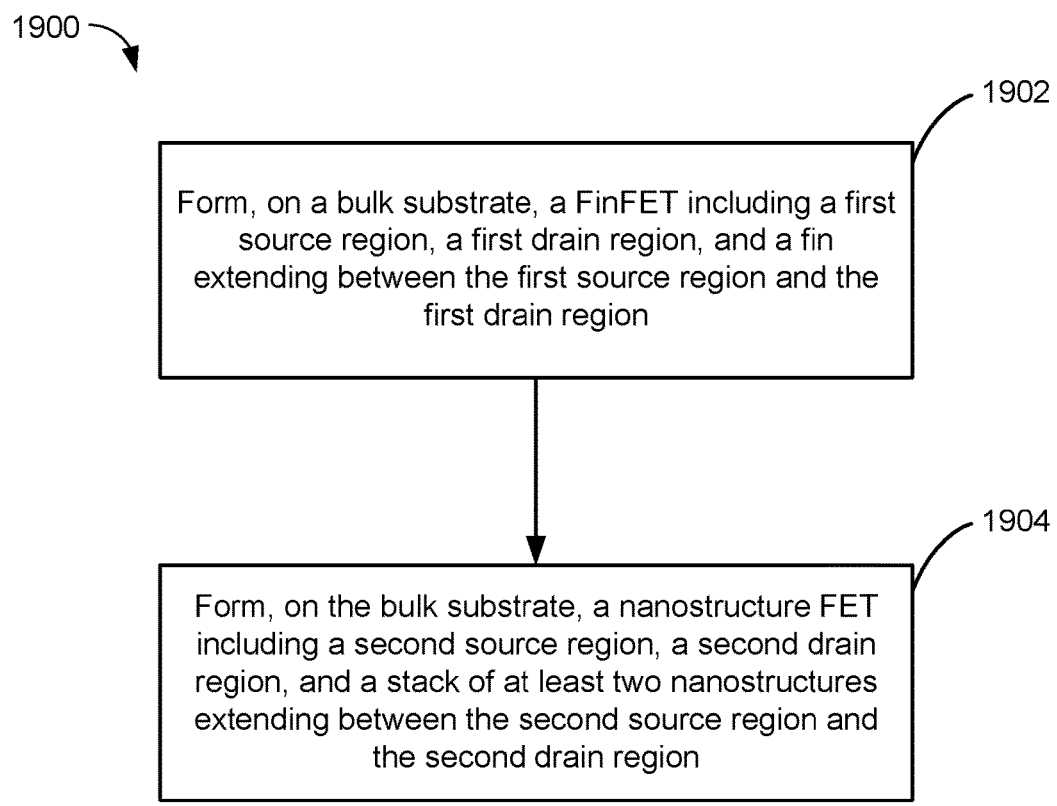
FIG. 19 is a flow chart of a particular illustrative flowchart of a method of fabricating the integrated circuit of FIG. 1A, the integrated circuit of FIG. 2A, the integrated circuit of FIG. 3A, or the integrated circuit of FIG. 4A.

Referring to FIG. 19, a method 1900 of forming an integrated circuit including a FinFET and a nanostructure FET on a bulk substrate is described. The method 1900 includes forming, on a bulk substrate, a FinFET that includes a first source region, a first drain region, and a fin extending between the first source region and the first drain region. The method 1900 also includes forming, on the bulk substrate, a nanostructure FET that includes a second source region, a second drain region, and a stack of at least two nanostructures extending between the second source region and the second drain region.

In some examples, the FinFET may correspond to the FinFET 133 of FIG. 1A or FIG. 2A, the nanostructure FET may correspond to the nanostructure FET 106 of FIG. 1A or to the nanostructure FET 206 of FIG. 2A, and the bulk substrate may correspond to the bulk substrate 500 of FIG. 5. The first source region may correspond to the first source region 115 of FIG. 1C or FIG. 2C and the first drain region may correspond to the first drain region 117 of FIG. 1C or FIG. 2C. The second source region may correspond to the second source region 111 of FIG. 1B or FIG. 2B and the second source region may correspond to the second source region 113 of FIG. 1B or FIG. 2B. The fin may correspond to the fin 185, the fin 187, the fin 189, the fin 190, the fin 192, or to the fin 195 of FIG. 1A or FIG. 2A. The stack of at least two nanostructures may correspond to the at least two nanostructures 107 and 109; the at least two nanostructures 123 and 125; the at least two nanostructures 171 and 173; or to the at least two nanostructures 175 and 177 of FIG. 1A; or may correspond to the at least two nanostructures 231, 232, and 234; the at least two nanostructures 235, 236, and 237; the at least two nanostructures 271, 272, and 273; or to the at least two nanostructures 274, 275, and 276 of FIG. 2A.

In these examples, the FinFET and the nanostructure FET may be formed as described above with reference to FIGS. 1A, 2A, and 5-11. For example, forming the FinFET and forming the nanostructure FET on the bulk substrate may include forming an alternating bilayer (e.g., an alternating bilayer stack) including first, second, third, fourth, and fifth epitaxial layers on the bulk substrate as described above with reference to the alternating bilayer 501 formed during the first stage of FIG. 5. As described above, in this example, the first epitaxial layer may be located between the second epitaxial layer and the bulk substrate, the third epitaxial layer may be located between the fourth epitaxial layer and the second epitaxial layer, and the fourth epitaxial layer may be located between the third epitaxial layer and the fifth epitaxial layer.

In these examples, forming the FinFET and forming the nanostructure FET may further include removing portions of the second, third, fourth, and fifth epitaxial layers proximate to a first region of the bulk substrate. For example, portions of the second epitaxial layer 504 of FIG. 5, portions of the third epitaxial layer 506, portions of the fourth epitaxial layer 508, and portions of the fifth epitaxial layer 510 may be removed proximate to the first region 602 of FIG. 6 of the bulk substrate 500 as described above with reference to the second stage of FIG. 6.

Forming the FinFET and the nanostructure FET may further include forming a fill layer proximate to the first region of the bulk substrate after removing portions of the second, third, fourth, and fifth epitaxial layers proximate to the first region of the bulk substrate. For example, the fill layer may correspond to the fill layer 702 of FIG. 7 and the fill layer 702 may be formed proximate to the first region 602 (in the opening 606 of FIG. 6) of the bulk substrate 500 as described above with reference to the third stage of FIG. 7.

Forming the FinFET and the nanostructure FET may further include removing portions of the alternating bilayer proximate to a second region of the bulk substrate to form a stack of portions of the alternating bilayer, and forming the fin by etching portions of the fill layer and portions of the first epitaxial layer proximate to the first region. For example, the portions of the alternating bilayer 501 of FIG. 5 that remain after the third stage of FIG. 7 and that are proximate to the second region 601 may be removed to form a stack, such as the stack 802, 804, 806, or 848 of FIG. 8 as described above with reference to the fourth stage of FIG. 8. As another example, the fin 185, the fin 187, the fin 189, the fin 190, the fin 192, or the fin 195 of FIG. 1A or FIG. 2A may be formed by etching portions of the fill layer 702 of FIG. 7 and portions of the first epitaxial layer 502 proximate to the first region 602 of the bulk substrate 500 as described above with reference to the fourth stage of FIG. 8.

Forming the FinFET and the nanostructure FET may further include forming a first base proximate to the stack of portions of the alternating bilayer by etching portions of the second region of the bulk substrate. For example, the first base may correspond to the nanostructure FET stack base 127, the nanostructure FET stack base 129, the nanostructure FET stack base 118, or the nanostructure FET stack base 139 of FIG. 1A, 2A, or 8 and may be formed by forming trenches in the bulk substrate 500 of FIG. 7 as described above with reference to the fourth stage of FIG. 8. For example, portions of the second region 601 of the bulk substrate 500 may be etched to form one or more of the trenches 830, 832, 834, or the first portion of the trench 836, thereby forming the one or more of the nanostructure FET stack bases 127, 129, 118, or 139.

Forming the FinFET and the nanostructure FET may further include forming a second base proximate to the fin by etching portions of the first region of the bulk substrate. For example, the second base may correspond to the FinFET stack base 13, 15, 17, 19, 21, or 23 of FIG. 1A, 2A, or 8 and may be formed by forming trenches in the first region 802 of the bulk substrate 500 of FIG. 7 as described above with reference to the fourth stage of FIG. 8. For example, portions of the first region 602 of the bulk substrate 500 may be etched to form one or more of the trenches 838, 840, 842, 844, or 846, thereby forming the one or more of the FinFET stack bases 13, 15, 17, 19, 21, or 23.

Forming the FinFET and the nanostructure FET may further include forming a dummy gate proximate to the stack of portions of the alternating bilayer and proximate to the fin. For example, the dummy gate may correspond to the dummy gates 902 and 904 of FIG. 9 and may be formed as described above with reference to the fifth stage of FIG. 9.

Forming the FinFET and the nanostructure FET may further include removing a first portion of the dummy gate proximate to the stack of portions of the alternating bilayer. For example, the first portion of the dummy gate may correspond to the dummy gate 902 of FIG. 9, and the dummy gate 902 may be removed as described above with reference to the sixth stage of FIG. 10 or the sixth stage of FIG. 11.

Forming the FinFET and the nanostructure FET may further include suspending one or more nanostructures of the stack of at least two nanostructures by removing one or more layers of the stack of portions of the alternating bilayer. For example, the stack of portions of the alternating bilayer may correspond to the stack 802 of FIG. 9 and removing the one or more layers of the stack of portions of the alternating bilayer may correspond to removing the nanostructure 234, the nanostructure 232, and the nanostructure 231 as described above with reference to the sixth stage of FIG. 10. As another example, the stack of portions of the alternating bilayer may correspond to the stack 802 of FIG. 9 and removing the one or more layers of the stack of portions of the alternating bilayer may correspond to removing the nanostructures 109 and 107 as described above with reference to the sixth stage of FIG. 11.

Forming the FinFET and the nanostructure FET may further include forming a dielectric layer proximate to each nanostructure of the stack of at least two nanostructures and proximate to the fin. The dielectric layer may be formed of or may include the dielectric material 901 of FIG. 9 and may be formed as described above with reference to the fifth stage of FIG. 9.

Forming the FinFET and the nanostructure FET may further include forming a gate region (e.g., a metal gate) proximate to the stack of at least two nanostructures and proximate to the fin. For example, the gate region proximate to the stack of at least two nanostructures may correspond to the gate region 110 of FIG. 1A or to the gate region 210 of FIG. 2A and may be formed as described above with reference to the seventh stage of FIG. 1A or FIG. 2A. As another example, the gate region proximate to the fin may correspond to the gate region 112 of FIG. 1A or FIG. 2A and may be formed as described above with reference to the seventh stage of FIG. 1A or FIG. 2A.

Alternatively or additionally, the FinFET may correspond to the FinFET 333 of FIG. 3A or FIG. 4A, the nanostructure FET may correspond to the nanostructure FET 306 of FIG. 3A or to the nanostructure FET 406 of FIG. 4A, and the bulk substrate may correspond to the bulk substrate 1200 of FIG. 12. The first source region may correspond to the first source region 315 of FIG. 3C or FIG. 4C and the first drain region may correspond to the first drain region 317 of FIG. 3C or FIG. 4C. The second source region may correspond to the second source region 311 of FIG. 3B or FIG. 4B and the second source region may correspond to the second source region 313 of FIG. 3B or FIG. 4B. The fin may correspond to the fin 72, the fin 74, the fin 76, the fin 78, the fin 80, or to the fin 303 of FIG. 3A or FIG. 4A. The stack of at least two nanostructures may correspond to the at least two nanostructures 307 and 309; the at least two nanostructures 323 and 325; the at least two nanostructures 371 and 373; or to the at least two nanostructures 375 and 377 of FIG. 3A; or may correspond to the at least two nanostructures 431, 432, and 435; the at least two nanostructures 423, 424, and 425; the at least two nanostructures 471, 472, and 473; or to the at least two nanostructures 474, 475, and 476 of FIG. 4A.

In these examples, the FinFET and the nanostructure FET may be formed as described above with reference to FIGS. 3A, 4A, and 12-18. For example, forming the FinFET and forming the nanostructure FET on the bulk substrate may include forming an alternating bilayer including first, second, third, fourth, and fifth epitaxial layers on the bulk substrate as described above with reference to the alternating bilayer 1201 formed during the first stage of FIG. 12. As described above, in this example, the first epitaxial layer may be located between the second epitaxial layer and the bulk substrate, the third epitaxial layer may be located between the fourth epitaxial layer and the second epitaxial layer, and the fourth epitaxial layer may be located between the third epitaxial layer and the fifth epitaxial layer.

In these examples, forming the FinFET and forming the nanostructure FET may further include removing portions of the third, fourth, and fifth epitaxial layers proximate to a first region of the bulk substrate. For example, portions of the third epitaxial layer 1206, portions of the fourth epitaxial layer 1208, and portions of the fifth epitaxial layer 1210 may be removed proximate to the first region 1393 of FIG. 13 of the bulk substrate 1200 as described above with reference to the second stage of FIG. 13.

Forming the FinFET and the nanostructure FET may further include forming a fill layer proximate to the first region of the bulk substrate after removing portions of the third, fourth, and fifth epitaxial layers proximate to the first region of the bulk substrate. For example, the fill layer may correspond to the fill layer 1402 of FIG. 14 and the fill layer 1402 may be formed proximate to the first region 1393 (in the opening 1302 of FIG. 13) of the bulk substrate 1200 as described above with reference to the third stage of FIG. 14.

Forming the FinFET and the nanostructure FET may further include removing portions of the alternating bilayer proximate to a second region of the bulk substrate to form a stack of portions of the alternating bilayer, and forming the fin by etching portions of the fill layer and portions of the first epitaxial layer proximate to the first region. For example, the portions of the alternating bilayer 1201 of FIG. 12 that remain after the third stage of FIG. 14 and that are proximate to the second region 1393 may be removed to form a stack such as the stack 1502, 1504, 1506, or 1548 of FIG. 15 as described above with reference to the fourth stage of FIG. 15. As another example, the fin 72, the fin 74, the fin 76, the fin 78, the fin 80, or the fin 303 may be formed by etching portions of the fill layer 1402 of FIG. 14 proximate to the first region 1393 of the bulk substrate 1200 as described above with reference to the fourth stage of FIG. 15.

Forming the FinFET and the nanostructure FET may further include forming a first base proximate to the stack of portions of the alternating bilayer by etching portions of the second region of the bulk substrate. For example, the first base may correspond to the nanostructure FET stack base 327, the nanostructure FET stack base 329, the nanostructure FET stack base 316, or the nanostructure FET stack base 317 of FIG. 15 and may be formed by forming trenches in the bulk substrate 1200 of FIG. 14 as described above with reference to the fourth stage of FIG. 15. For example, portions of the second region 1391 of the bulk substrate 1200 may be etched to form one or more of the trenches 1530, 1532, 1534, or the first portion of the trench 1536, thereby forming the one or more of the nanostructure FET stack bases 327, 329, 316, or 317.

Forming the FinFET and the nanostructure FET may further include forming a second base proximate to the fin by etching portions of the first region of the bulk substrate. For example, the second base may correspond to a FinFET stack base formed of the portions 65, 733, and 833 of FIG. 15; a FinFET stack base formed of the portions 355, 75, and 85; a FinFET stack base formed of the portions 37, 77, and 87; a FinFET stack base formed of the portions 39, 79, and 89; a FinFET stack base formed of the portions 41, 81, and 59; or a FinFET stack base formed of the portions 64, 319, and 318. The second base may be formed by etching portions of the first and second epitaxial layers 1202 and 1204 proximate to the first region 1393 of the bulk substrate 1200 of FIG. 14 and by forming trenches in the first region 1393 of the bulk substrate 1200 of FIG. 14 as described above with reference to the fourth stage of FIG. 15.

Forming the FinFET and the nanostructure FET may further include forming a dummy gate proximate to the stack of portions of the alternating bilayer and proximate to the fin. For example, the dummy gate may correspond to the dummy gates 1602 and 1604 of FIG. 16 and may be formed as described above with reference to the fifth stage of FIG. 16.

Forming the FinFET and the nanostructure FET may further include removing a first portion of the dummy gate proximate to the stack of portions of the alternating bilayer. For example, the first portion of the dummy gate may correspond to the dummy gate 1602 of FIG. 16, and the dummy gate 1602 may be removed as described above with reference to the sixth stage of FIG. 17 or the sixth stage of FIG. 18.

Forming the FinFET and the nanostructure FET may further include suspending one or more nanostructures of the stack of at least two nanostructures by removing one or more layers of the stack of portions of the alternating bilayer. For example, the stack of portions of the alternating bilayer may correspond to the stack 1502 of FIG. 16 and removing the one or more layers of the stack of portions of the alternating bilayer may correspond to removing the nanostructure 435, the nanostructure 432, and the nanostructure 431 as described above with reference to the sixth stage of FIG. 17. As another example, the stack of portions of the alternating bilayer may correspond to the stack 1502 of FIG. 16 and removing the one or more layers of the stack of portions of the alternating bilayer may correspond to removing the at least two nanostructures 309 and 307 as described above with reference to the sixth stage of FIG. 18.

Forming the FinFET and the nanostructure FET may further include forming a dielectric layer proximate to each nanostructure of the stack of at least two nanostructures and proximate to the fin. The dielectric layer may be formed of or include the dielectric material 1601 of FIG. 16 and may be formed as described above with reference to the fifth stage of FIG. 16.

Forming the FinFET and the nanostructure FET may further include forming a gate region proximate to the stack of at least two nanostructures and proximate to the fin. For example, the gate region proximate to the stack of at least two nanostructures may correspond to the gate region 310 of FIG. 3A or the gate region 410 of FIG. 4A and may be formed as described above with reference to the seventh stage of FIG. 3A or FIG. 4A. As another example, the gate region proximate to the fin may correspond to the gate region 312 of FIG. 3A or to the gate region 412 of FIG. 4A and may be formed as described above with reference to the seventh stage of FIG. 3A or FIG. 4A.

Thus, the method of FIG. 19 may include forming an integrated circuit that includes a FinFET and a nanostructure FET on a single substrate, thereby decreasing space relative to FinFETs and nanowire FETs formed on different substrates. Additionally, the nanostructure FET may include multiple nanostructures per nanostructure stacks, which may increase current capacity compared to nanostructure FETs that include a single nanostructure per nanostructure stack.

Referring to FIG. 20, a block diagram of a particular illustrative example of a wireless communication device is depicted and generally designated 2000. The wireless communication device 2000 includes a processor 2010, such as a digital signal processor (DSP), coupled to a memory 2032 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The memory may include one or more electronic devices 2202 (e.g., an integrated circuit). In an illustrative example, the one or more electronic devices 2202 may include or may correspond to the integrated circuit 100 of FIG. 1A, the integrated circuit 200 of FIG. 2A, the integrated circuit 300 of FIG. 3A, or the integrated circuit 400 of FIG. 4A.

FIG. 20 also shows a display controller 2026 that is coupled to the processor 2010 and to a display 2028. A coder/decoder (CODEC) 2034 may also be coupled to the processor 2010. A speaker 2036 and a microphone 2038 may be coupled to the CODEC 2034.

FIG. 20 also indicates that a wireless controller 2040 may be coupled to the processor 2010 and may be further coupled to an antenna 2042. In a particular example, the processor 2010, the display controller 2026, the memory 2032, the CODEC 2034, and the wireless controller 2040 are included in a system-in-package or system-on-chip device 2022. In a particular example, an input device 2030 and a power supply 2044 are coupled to the system-on-chip device 2022. Moreover, in a particular example, as illustrated in FIG. 20, the display 2028, the input device 2030, the speaker 2036, the microphone 2038, the antenna 2042, and the power supply 2044 are external to the system-on-chip device 2022. However, each of the display 2028, the input device 2030, the speaker 2036, the microphone 2038, the antenna 2042, and the power supply 2044 may be coupled to a component of the system-on-chip device 2022, such as an interface or a controller.

In conjunction with the described examples and aspects, a system is disclosed that may include first means for providing charge carriers, such as the first source region 115 of FIG. 1C or 2C or the first source region 315 of FIGS. 3C and 4C. The first means for providing charge carriers may be formed on a bulk substrate, such as the bulk substrate 108 of FIGS. 1A and 2A or the bulk substrate 308 of FIG. 3A or 4A. The system also includes first means for collecting charge carriers, such as the first drain region 117 of FIG. 1C or 2C or the first drain region 317 of FIG. 3C or 4C. The first means for collecting charge carriers may be formed on the bulk substrate (e.g., the bulk substrate 108 of FIG. 1A or 2A or the bulk substrate 308 of FIG. 3A or 4A).

The system also includes first means for forming a conductive channel coupled to the first means for providing and the first means for collecting. The first means for forming a conductive channel may correspond to one or more of the fins 185, 187, 189, 190, 192, or 195 of FIG. 1A or 2A or to one or more of the fins 72, 74, 76, 78, 80, or 303 of FIG. 3A or 4A. The first means for forming a conductive channel may be formed on the bulk substrate (e.g., the bulk substrate 108 of FIG. 1A or 2A or the bulk substrate 308 of FIG. 3A or 4A).

The system also includes second means for providing charge carriers, such as the second source region 111 of FIG. 1B or 2B or the second source region 311 of FIG. 3B or 4B. The second means for providing charge carriers may be formed on the bulk substrate (e.g., the bulk substrate 108 of FIG. 1A or 2A or the bulk substrate 308 of FIG. 3A or 4A).

The system also includes second means for collecting charge carriers, such as the second drain region 113 of FIG. 1B or 2B or the second drain region 313 of FIG. 3B or 4B. The second means for collecting charge carriers may be formed on the bulk substrate (e.g., the bulk substrate 108 of FIG. 1A or 2A or the bulk substrate 308 of FIG. 3A or 4A).

The system also includes second means for forming a conductive channel coupled to the second means for providing and the second means for collecting. The second means for forming the conductive channel includes multiple structures, and each structure of the multiple structure may have dimensions on the order of a nanometer. For example, the second means for forming a conductive channel may correspond to one or more stacks of the at least two nanostructures 107 and 109; 123 and 125; 171 and 173, or 175 and 177 of FIG. 1A; to one or more of stacks of the at least two nanostructures 231, 232, and 234; 235, 236, and 237; 271, 272, and 273; or 274, 275, and 276 of FIG. 2A; to one or more stacks of the nanostructure 307 and 309; 323 and 325; 371 and 373; or 375 and 377 of FIG. 3A; or to one or more stacks of the at least two nanostructures 431, 432, and 435; 423, 424, and 425; 471, 472, and 473; 474, 475, and 476 of FIG. 4A.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 21.

Referring to FIG. 21, a particular illustrative example of an electronic device manufacturing (e.g., fabricating) process is depicted and generally designated 2100. Physical device information 2102 is received at the manufacturing process 2100, such as at a research computer 2106. The physical device information 2102 may include design information representing at least one physical property of a semiconductor device, such as the integrated circuit 100 of FIG. 1A, the integrated circuit 200 of FIG. 2A, the integrated circuit 300 of FIG. 3A, the integrated circuit 400 of FIG. 4A, or any combination thereof. For example, the physical device information 2102 may include physical parameters, material characteristics, and structure information that is entered via a user interface 2104 coupled to the research computer 2106. The research computer 2106 includes a processor 2108, such as one or more processing cores, coupled to a computer readable medium (e.g., a non-transitory computer-readable storage medium), such as a memory 2110. The memory 2110 may store computer readable instructions that are executable to cause the processor 2108 to transform the physical device information 2102 to comply with a file format and to generate a library file 2112.

In a particular example, the library file 2112 includes at least one data file including the transformed design information. For example, the library file 2112 may include a library of semiconductor devices including a device that includes the integrated circuit 100 of FIG. 1A, the integrated circuit 200 of FIG. 2A, the integrated circuit 300 of FIG. 3A, the integrated circuit 400 of FIG. 4A, or any combination thereof, that is provided for use with an electronic design automation (EDA) tool 2120.

The library file 2112 may be used in conjunction with the EDA tool 2120 at a design computer 2114 including a processor 2116, such as one or more processing cores, coupled to a memory 2118. The EDA tool 2120 may be stored as processor executable instructions at the memory 2118 to enable a user of the design computer 2114 to design a circuit including the integrated circuit 100 of FIG. 1A, the integrated circuit 200 of FIG. 2A, the integrated circuit 300 of FIG. 3A, the integrated circuit 400 of FIG. 4A, or any combination thereof, of the library file 2112. For example, a user of the design computer 2114 may enter circuit design information 2122 via a user interface 2124 coupled to the design computer 2114. The circuit design information 2122 may include design information representing at least one physical property of a semiconductor device, such as the integrated circuit 100 of FIG. 1A, the integrated circuit 200 of FIG. 2A, the integrated circuit 300 of FIG. 3A, the integrated circuit 400 of FIG. 4A, or any combination thereof. To illustrate, the circuit design property may include identification of particular circuits and relationships to other elements in a circuit design, positioning information, feature size information, interconnection information, or other information representing a physical property of a semiconductor device.

The design computer 2114 may be configured to transform the design information, including the circuit design information 2122, to comply with a file format. To illustrate, the file format may include a database binary file format representing planar geometric shapes, text labels, and other information about a circuit layout in a hierarchical format, such as a Graphic Data System (GDSII) file format. The design computer 2114 may be configured to generate a data file including the transformed design information, such as a GDSII file 2126 that includes information describing the integrated circuit 100 of FIG. 1A, the integrated circuit 200 of FIG. 2A, the integrated circuit 300 of FIG. 3A, the integrated circuit 400 of FIG. 4A, or any combination thereof, in addition to other circuits or information. To illustrate, the data file may include information corresponding to a system-on-chip (SOC) that includes the integrated circuit 100 of FIG. 1A, the integrated circuit 200 of FIG. 2A, the integrated circuit 300 of FIG. 3A, the integrated circuit 400 of FIG. 4A, and that also includes additional electronic circuits and components within the SOC.

The GDSII file 2126 may be received at a fabrication process 2128 to fabricate the integrated circuit 100 of FIG. 1A, the integrated circuit 200 of FIG. 2A, the integrated circuit 300 of FIG. 3A, the integrated circuit 400 of FIG. 4A, or any combination thereof, according to transformed information in the GDSII file 2126. For example, a device manufacturing process may include providing the GDSII file 2126 to a mask manufacturer 2130 to create one or more masks, such as masks to be used with photolithography processing, illustrated as a representative mask 2132. The mask 2132 may be used during the fabrication process to generate one or more wafers 2134, which may be tested and separated into dies, such as a representative die 2136. The die 2136 includes a circuit including a device that includes the integrated circuit 100 of FIG. 1A, the integrated circuit 200 of FIG. 2A, the integrated circuit 300 of FIG. 3A, the integrated circuit 400 of FIG. 4A, or any combination thereof.

For example, the fabrication process 2128 may include a processor 2127 and a memory 2129 to initiate and control the fabrication process 2128. The memory 2129 may include executable instructions such as computer-readable instructions or processor-readable instructions. The executable instructions may include one or more instructions that are executable by a computer such as the processor 2127. In a particular example, the executable instructions may cause a computer to perform the method 1900 of FIG. 19.

The fabrication process 2128 may be implemented by a fabrication system that is fully automated or partially automated. For example, the fabrication process 2128 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. The specific process or combination of processes used to manufacture a device (e.g., including the integrated circuit 100 of FIG. 1A, the integrated circuit 200 of FIG. 2A, the integrated circuit 300 of FIG. 3A, or the integrated circuit 400 of FIG. 4A) may be based on design constraints and available materials/equipment. Thus, in particular examples, different processes may be used than described with reference to FIGS. 5-18 during manufacture of the device.

The fabrication system (e.g., an automated system that performs the fabrication process 2128) may have a distributed architecture (e.g., a hierarchy). For example, the fabrication system may include one or more processors, such as the processor 2127, one or more memories, such as the memory 2129, and controllers that are distributed according to the distributed architecture. The distributed architecture may include a high-level processor that controls or initiates operations of one or more low-level systems. For example, a high-level portion of the fabrication process 2128 may include one or more processors, such as the processor 2127, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular example, the fabrication system may include multiple processors that are distributed in the fabrication system. For example, a controller of a low-level system component may include a processor, such as the processor 2127.

Alternatively, the processor 2127 may be a part of a high-level system, subsystem, or component of the fabrication system. In another example, the processor 2127 includes distributed processing at various levels and components of a fabrication system.

The executable instructions included in the memory 2129 may enable the processor 2127 to form (or initiate formation of) the integrated circuit 100 of FIG. 1A, the integrated circuit 200 of FIG. 2A, the integrated circuit 300 of FIG. 3A, and the integrated circuit 400 of FIG. 4A. In a particular example, the memory 2129 is a non-transitory computer-readable medium storing computer-executable instructions that are executable by the processor 2127 to cause the processor 2127 to initiate formation of a device in accordance with at least a portion of the method 1900 of FIG. 9. For example, the computer executable instructions may be executable to cause the processor 2127 to initiate formation of the integrated circuit 100 of FIG. 1A, the integrated circuit 200 of FIG. 2A, the integrated circuit 300 of FIG. 3A, and the integrated circuit 400 of FIG. 4A. As an illustrative example, the processor 2127 may initiate or control one or more steps of the method 1900 of FIG. 19.

The die 2136 may be provided to a packaging process 2138 where the die 2136 is incorporated into a representative package 2140. For example, the package 2140 may include the single die 2136 or multiple dies, such as a system-in-package (SiP) arrangement. The package 2140 may be configured to conform to one or more standards or specifications, such as Joint Electron Device Engineering Council (JEDEC) standards.

Information regarding the package 2140 may be distributed to various product designers, such as via a component library stored at a computer 2146. The computer 2146 may include a processor 2148, such as one or more processing cores, coupled to a memory 2150. A printed circuit board (PCB) tool may be stored as processor executable instructions at the memory 2150 to process PCB design information 2142 received from a user of the computer 2146 via a user interface 2144. The PCB design information 2142 may include physical positioning information of a packaged semiconductor device on a circuit board, the packaged semiconductor device corresponding to the package 2140 including the integrated circuit 100 of FIG. 1A, the integrated circuit 200 of FIG. 2A, the integrated circuit 300 of FIG. 3A, and the integrated circuit 400 of FIG. 4A, or any combination thereof.

The computer 2146 may be configured to transform the PCB design information 2142 to generate a data file, such as a GERBER file 2152 with data that includes physical positioning information of a packaged semiconductor device on a circuit board, as well as layout of electrical connections such as traces and vias, where the packaged semiconductor device corresponds to the package 2140 including the integrated circuit 100 of FIG. 1A, the integrated circuit 200 of FIG. 2A, the integrated circuit 300 of FIG. 3A, and the integrated circuit 400 of FIG. 4A, or any combination thereof. In other examples, the data file generated by the transformed PCB design information may have a format other than a GERBER format.

The GERBER file 2152 may be received at a board assembly process 2154 and used to create PCBs, such as a representative PCB 2156, manufactured in accordance with the design information stored within the GERBER file 2152. For example, the GERBER file 2152 may be uploaded to one or more machines to perform various steps of a PCB production process. The PCB 2156 may be populated with electronic components including the package 2140 to form a representative printed circuit assembly (PCA) 2158.

The PCA 2158 may be received at a product manufacturing process 2160 and integrated into one or more electronic devices, such as a first representative electronic device 2162 and a second representative electronic device 2164. For example, the first representative electronic device 2162, the second representative electronic device 2164, or both, may include or correspond to the wireless communication device 2000 of FIG. 20. As an illustrative, non-limiting example, the first representative electronic device 2162, the second representative electronic device 2164, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 2162, the second representative electronic device 2164, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the into which the integrated circuit 100 of FIG. 1A, the integrated circuit 200 of FIG. 2A, the integrated circuit 300 of FIG. 3A, and the integrated circuit 400 of FIG. 4A is integrated.

As another illustrative, non-limiting example, one or more of the electronic devices 2162 and 2164 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 21 illustrates remote units according to teachings of the disclosure, the disclosure is not limited to these illustrated units. Examples of the disclosure may be suitably employed in any device which includes active integrated circuitry including memory and on-chip circuitry. For example, one or more of the electronic device 2162 and 2164 may include cars, trucks, airplanes, boats, other vehicles, or appliances, such as refrigerators, microwaves, washing machines, security systems, other appliances, or a combination thereof. In a particular example, one or more of the electronic device 2162 and 2164 may utilize memory and wireless communication.

A device that includes the integrated circuit 100 of FIG. 1A, the integrated circuit 200 of FIG. 2A, the integrated circuit 300 of FIG. 3A, the integrated circuit 400 of FIG. 4A, or any combination thereof, may be fabricated, processed, and incorporated into an electronic device, as described in the illustrative process 2100. One or more aspects of the examples disclosed with respect to FIGS. 1-20 may be included at various processing stages, such as within the library file 2112, the GDSII file 2126 (e.g., a file having a GDSII format), and the GERBER file 2152 (e.g., a file having a GERBER format), as well as stored at the memory 2110 of the research computer 2106, the memory 2118 of the design computer 2114, the memory 2150 of the computer 2146, the memory of one or more other computers or processors (not shown) used at the various stages, such as at the board assembly process 2154, and also incorporated into one or more other physical examples such as the mask 2132, the die 2136, the package 2140, the PCA 2158, other products such as prototype circuits or devices (not shown), or any combination thereof. Although various representative stages of production from a physical device design to a final product are depicted, in other examples fewer stages may be used or additional stages may be included. Similarly, the process 2100 may be performed by a single entity or by one or more entities performing various stages of the process 2100.

Although one or more of FIG. 1-21 may illustrate systems, devices, and methods according to the teachings of the disclosure, the disclosure is not limited to these illustrated systems, devices, and methods. Examples and aspects of the disclosure may be suitably employed in any device that includes integrated circuitry including memory, a processor, and on-chip circuitry.

One or more functions or components of any of FIGS. 1-21 as illustrated or described herein may be combined with one or more other portions of another of FIGS. 1-21. Accordingly, no single example or aspect described herein should be construed as limiting and examples and aspects of the disclosure may be suitably combined without departing form the teachings of the disclosure.

Those of skill would further appreciate that the various illustrative logical blocks, configurations, modules, circuits, and algorithm steps described in connection with the examples and aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the examples and aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed examples and aspects is provided to enable a person skilled in the art to make or use the disclosed examples and aspects. Various modifications to these examples and aspects will be readily apparent to those skilled in the art, and the principles defined herein may be applied to other examples and aspects without departing from the scope of the disclosure. Thus, the present disclosure is not intended to be limited to the examples and aspects shown herein but is to be accorded the widest scope possible consistent with the principles and novel features as defined by the following claims.

What is claimed is:

1. An integrated circuit comprising:
   a bulk substrate;
   a fin field effect transistor (FinFET) coupled to the bulk substrate and including a first source region, a first drain region, and an elongated fin of semiconductor material extending between the first source region and the first drain region;
   a nanostructure FET coupled to the bulk substrate and including a second source region, a second drain region, and a stack of at least two nanostructures extending between the second source region and the second drain region, each nanostructure of the at least two nanostructures having a first width, the first width different than a width of the elongated fin of the FinFET; and
   a shallow trench isolation (STI) region disposed between the FinFET and the nanostructure FET, the STI region having a top surface coplanar with a surface of a layer of the FinFET, the layer disposed between the elongated fin and the bulk substrate.

2. The integrated circuit of claim 1, wherein the stack includes multiple epitaxial layers and the elongated fin includes a single epitaxial layer, and wherein each nanostructure of the at least two nanostructures includes a nanowire or a nanoslab, each nanostructure having a first height, the first height different than a height of the elongated fin of the FinFET, wherein the elongated fin extends vertically above the bulk substrate.

3. The integrated circuit of claim 1, wherein the nanostructure FET further includes a gate region between the second source region and the second drain region, at least a portion of the gate region coupled to the STI region.

4. The integrated circuit of claim 1, wherein the elongated fin includes a first material, the elongated fin coupled to the layer of the FinFET, the layer including a second material, the second material different than the first material.

5. The integrated circuit of claim 4, wherein the second material includes silicon germanium.

6. The integrated circuit of claim 1, wherein a top of the elongated fin and a top of the stack of at least two nanostructures are substantially the same distance from the bulk substrate.

7. The integrated circuit of claim 1, wherein a top of the elongated fin is a first distance from the bulk substrate and a top of the stack of at least two nanostructures is a second distance from the bulk substrate, the first distance greater than the second distance.

8. The integrated circuit of claim 1, wherein the nanostructure FET includes a p-type FET and the stack of at least two nanostructures includes at least three nanostructures, and wherein the at least three nanostructures are suspended by the second source region the second drain region.

9. The integrated circuit of claim 1, further comprising:
   a second FinFET coupled to the bulk substrate and including a third source region, a third drain region, and a second elongated fin extending between the third source region and the third drain region; and
   a second nanostructure FET coupled to the bulk substrate and including a fourth source region, a fourth drain region, and a second stack of at least three nanostructures extending between the fourth source region and the fourth drain region, wherein the at least two nanostructures of the second stack consists of two nanostructures, and wherein one of the stack or the second stack includes multiple epitaxial layers and the elongated fin or the second elongated fin includes a single epitaxial layer.

10. The integrated circuit of claim 1, wherein one of the at least two nanostructures is disposed on a portion of the bulk substrate.

11. The integrated circuit of claim 1, wherein the top surface of the STI region is coplanar with a surface of one of the at least two nanostructures.

12. The integrated circuit of claim 1, wherein a sidewall of the elongated fin of the FinFET faces a sidewall of the stack of the nanostructure FET in a direction perpendicular to the direction of the length of a trench formed in the bulk substrate.

13. The integrated circuit of claim 1, further comprising a trench formed in the bulk substrate between the FinFET and the nanostructure FET, the trench having a length oriented in a direction substantially parallel to a length of the at least two nanostructures, the trench having a first sidewall coplanar with a sidewall of the elongated fin of the FinFET.

14. The integrated circuit of claim 13, wherein a second sidewall of the trench is coplanar with a sidewall of one of the at least two nanostructures.

15. A method comprising:
   forming, on a bulk substrate, a fin field effect transistor (FinFET) including a first source region, a first drain region, and an elongated fin of semiconductor material extending between the first source region and the first drain region;
   forming, on the bulk substrate, a nanostructure FET including a second source region, a second drain region, and a stack of at least two nanostructures extending between the second source region and the second drain region, wherein each nanostructure of the at least two nanostructures is formed having a first width, the first width different than a width of the elongated fin of the FinFET; and
   forming a shallow trench isolation (STI) region between the FinFET and the nanostructure FET, the STI region having a top surface coplanar with a surface of a layer of the FinFET, the layer disposed between the elongated fin and the bulk substrate.

16. The method of claim 15, wherein forming the FinFET and forming the nanostructure FET on the bulk substrate comprises forming an alternating bilayer including first, second, third, fourth, and fifth epitaxial layers on the bulk substrate, the first epitaxial layer between the second epitaxial layer and the bulk substrate, the third epitaxial layer between the fourth epitaxial layer and the second epitaxial layer, and the fourth epitaxial layer between the third epitaxial layer and the fifth epitaxial layer.

17. The method of claim 16, further comprising removing portions of the second, third, fourth, and fifth epitaxial layers proximate to a first region of the bulk substrate.

18. The method of claim 17, further comprising forming a fill layer proximate to the first region of the bulk substrate after removing portions of the second, third, fourth, and fifth epitaxial layers proximate to the first region of the bulk substrate.

19. The method of claim 18, further comprising:
removing portions of the alternating bilayer proximate to a second region of the bulk substrate to form a stack of portions of the alternating bilayer; and
forming the elongated fin by etching portions of the fill layer and portions of the first epitaxial layer proximate to the first region.

20. The method of claim 16, further comprising removing portions of the third, fourth, and fifth epitaxial layers proximate to a first region of the bulk substrate.

21. The method of claim 20, further comprising forming a fill layer proximate to the first region of the bulk substrate after removing portions of the third, fourth, and fifth epitaxial layers proximate to the first region of the bulk substrate.

22. The method of claim 21, further comprising:
removing portions of the alternating bilayer proximate to a second region of the bulk substrate to form a stack of portions of the alternating bilayer; and
forming the elongated fin by etching portions of the fill layer proximate to the first region.

23. The method of claim 22, further comprising forming a FinFET stack base proximate to the elongated fin by etching portions of the first region of the bulk substrate, portions of the first epitaxial layer, and portions of the second epitaxial layer.

24. A non-transitory computer-readable medium comprising processor-executable instructions that, when executed by a processor, cause the processor to:
initiate fabrication of an integrated circuit device, the integrated circuit device fabricated by:
forming, on a bulk substrate, a fin field effect transistor (FinFET) including a first source region, a first drain region, and an elongated fin of semiconductor material extending between the first source region and the first drain region;
forming, on the bulk substrate, a nanostructure FET including a second source region, a second drain region, and a stack of at least two nanostructures extending between the second source region and the second drain region, each nanostructure of the at least two nanostructures formed having a first width, the first width different than a width of the elongated fin of the FinFET; and
forming a shallow trench isolation (STI) region between the FinFET and the nanostructure FET, the STI region having a top surface coplanar with a surface of a layer of the FinFET, the layer disposed between the elongated fin and the bulk substrate.

25. The non-transitory computer-readable medium of claim 24, wherein forming the FinFET and forming the nanostructure FET on the bulk substrate comprises forming an alternating bilayer including first, second, third, fourth, and fifth epitaxial layers on the bulk substrate, the first epitaxial layer between the second epitaxial layer and the bulk substrate, the third epitaxial layer between the fourth epitaxial layer and the second epitaxial layer, and the fourth epitaxial layer between the third epitaxial layer and the fifth epitaxial layer.

26. The non-transitory computer-readable medium of claim 25, wherein the integrated circuit device is further fabricated by removing portions of the second, third, fourth, and fifth epitaxial layers proximate to a first region of the bulk substrate.

27. The non-transitory computer-readable medium of claim 26, wherein the integrated circuit device is further fabricated by:
forming a fill layer proximate to the first region of the bulk substrate after removing portions of the second, third, fourth, and fifth epitaxial layers proximate to the first region of the bulk substrate;
removing portions of the alternating bilayer proximate to a second region of the bulk substrate to form a stack of portions of the alternating bilayer; and
forming the elongated fin by etching portions of the fill layer and portions of the first epitaxial layer proximate to the first region.

28. A device comprising:
first means for providing charge carriers formed on a bulk substrate;
first means for collecting charge carriers formed on the bulk substrate;
first means for forming a first conductive channel coupled to the first means for providing and the first means for collecting, the first means for forming a first conductive channel formed on the bulk substrate and comprising an elongated fin;
second means for providing charge carriers formed on the bulk substrate;
second means for collecting charge carriers formed on the bulk substrate; and
second means for forming a second conductive channel coupled to the second means for providing and the second means for collecting, the second means for forming a second conductive channel having multiple structures, each of the multiple structures having dimensions on the order of a nanometer, the second means for forming a first conductive channel having a first width, the first width different than a width of the first means for forming a second conductive channel; and
means for isolating the first means for forming a first conductive channel and the second means for forming a second conductive channel, the means for isolating having a top surface coplanar with a surface of a layer disposed between the first means for forming a conductive channel and the bulk substrate.

29. The device of claim 28, wherein a top of the first means for forming a first conductive channel and a top of the second means for forming a second conductive channel are substantially the same distance from the bulk substrate.

30. The device of claim 28, wherein a top of the first means for forming a first conductive channel is a first distance from the bulk substrate and a top of the second means for forming a second conductive channel is a second distance from the bulk substrate, the first distance equal to or greater than the second distance.

* * * * *